United States Patent
Hirano et al.

(10) Patent No.: US 6,538,482 B2
(45) Date of Patent: Mar. 25, 2003

(54) VOLTAGE DETECTION CIRCUIT, POWER-ON/OFF RESET CIRCUIT, AND SEMICONDUCTOR DEVICE

(75) Inventors: Hiroshige Hirano, Nara (JP); Kouji Asari, Takatsuki (JP); Tatsumi Sumi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/803,775

(22) Filed: Mar. 12, 2001

(65) Prior Publication Data

US 2001/0036119 A1 Nov. 1, 2001

Related U.S. Application Data

(62) Division of application No. 09/198,726, filed on Nov. 24, 1998, now Pat. No. 6,246,624, which is a division of application No. 08/817,746, filed on Jul. 9, 1997, now Pat. No. 5,864,247.

(30) Foreign Application Priority Data

Aug. 21, 1995 (JP) ............................................. 7-211942

(51) Int. Cl.$^7$ ................................................. H03L 7/00
(52) U.S. Cl. ...................................... 327/143; 327/198
(58) Field of Search ................................. 327/143, 198

(56) References Cited

U.S. PATENT DOCUMENTS

| 4,545,889 | A | * | 10/1985 | Franx | .................. | 204/406 |
|---|---|---|---|---|---|---|
| 5,083,045 | A | | 1/1992 | Yim et al. | .................. | 327/51 |
| 5,109,257 | A | | 4/1992 | Kondo | .................. | 365/185.18 |
| 5,243,233 | A | | 9/1993 | Cliff | .................. | 327/143 |
| 5,262,705 | A | * | 11/1993 | Hattori | .................. | 318/479 |
| 5,302,861 | A | | 4/1994 | Jelinek | .................. | 329/143 |
| 5,305,275 | A | | 4/1994 | Yamashita et al. | ..... | 365/185.21 |
| 5,479,172 | A | | 12/1995 | Smith et al. | .................. | 342/51 |
| 5,629,646 | A | * | 5/1997 | Menezes et al. | ............ | 327/535 |
| 5,721,887 | A | | 2/1998 | Nakajima | .................... | 713/500 |
| 5,723,990 | A | | 3/1998 | Roohparvar | .................. | 327/81 |
| 5,786,716 | A | | 7/1998 | Honda et al. | ................ | 327/143 |

FOREIGN PATENT DOCUMENTS

| DE | 33210398 | 9/1984 |
|---|---|---|
| EP | 0 573 965 | 12/1993 |
| GB | 2 216 303 | 10/1989 |
| JP | 59016414 | 1/1984 |
| JP | 59-129986 | 7/1984 |
| JP | 61-214042 | 9/1986 |
| JP | 63-261168 | 10/1988 |
| JP | 64-3716 | 1/1989 |
| JP | 01182757 | 7/1989 |
| JP | 1-191281 | 8/1989 |
| JP | 2-121193 | 5/1990 |
| JP | 2-216598 | 8/1990 |
| JP | 2-290568 | 11/1990 |
| JP | 3-280117 | 12/1991 |
| JP | 4-340148 | 11/1992 |
| JP | 6-28066 | 2/1994 |
| JP | 6-350423 | 12/1994 |
| JP | 7-73057 | 3/1995 |

\* cited by examiner

Primary Examiner—Terry D. Cunningham
Assistant Examiner—Quan Tra
(74) Attorney, Agent, or Firm—RatnerPrestia

(57) ABSTRACT

The present invention comprises a first MOS transistor whose gate and drain are connected with a first node, a second MOS transistor whose gate and drain are connected with the first node and a third node, respectively, a first resistive element which is connected between the first node and a second node, a second resistive element which is connected between the second node and a ground voltage terminal, a first NOT circuit whose input terminal is connected with the second node, whose output terminal is a fourth node, and which is connected between the third node and the ground voltage terminal, and a second NOT circuit whose input terminal is connected with the fourth node and whose output terminal is a fifth node. Consequently, the present invention can detect voltage in a stable condition with low power consumption.

12 Claims, 19 Drawing Sheets

US 6,538,482 B2

VOLTAGE DETECTION CIRCUIT, POWER-ON/OFF RESET CIRCUIT, AND SEMICONDUCTOR DEVICE

This application is a division of U.S. patent application Ser. No. 09/198,726, filed Nov. 24, 1998, now U.S. Pat. No. 6,246,614, , which is a division of U.S. patent application Ser. No. 08/817,746, filed Jul. 9, 1997, now U.S. Pat. No. 5,864,247.

FIELD OF THE INVENTION

The present invention relates to a voltage detection circuit for detecting a power-supply voltage or the like, a power-on/off reset circuit, and a semiconductor device.

BACKGROUND OF THE INVENTION

Recently, a technique has become popular for operating a semiconductor device in a stable condition in a wide power-supply voltage range by changing the internal circuit operation in accordance with the power-supply voltage value. For this reason, a voltage detection circuit for detecting a power-supply voltage value has become important.

A conventional voltage detection circuit will be explained hereinafter with reference to FIGS. 23–25. FIG. 23 shows the construction of the conventional voltage detection circuit. FIG. 24 shows the relationship between the power-supply voltage and the output voltage signal in the conventional voltage detection circuit. FIG. 25 shows the relationship between the power-supply voltage and the current drain.

Firstly, the circuit construction will be explained. As shown in FIG. 23, the Qp 61 is a P-channel type MOS transistor whose source is connected with the power-supply voltage VDD and whose gate and train are connected with the node N 61. The Qp 62 is a P-channel type MOS transistor whose source is connected with the node N 61 and whose gate and train are connected with the node N 62. The Qp 63 is a P-channel type MOS transistor whose source is connected with the node N 62 and whose gate and train are connected with the node N 63. The Qn 61 is an N-channel type MOS transistor whose source is connected with the ground voltage VSS, whose gate is connected with the power-supply voltage VDD, and whose train is connected with the node N 63. The Qp 64 is a P-channel type MOS transistor and the Qn 62 is an N-channel type MOS transistor which compose a first NOT circuit 61. The source, gate, and drain of the P-channel type MOS transistor Qp 64 are connected with the ground voltage VDD, the node N 63, and the node N 64, respectively. The source, gate, and drain of the N-channel type MOS transistor Qn 62 are connected with the ground voltage VSS, the node N 63, and the node N 64, respectively. The node N 64 is connected with the input terminal of a second NOT circuit 62. The second NOT circuit 62 is applied with the voltage detection signal VDT 60 from the node N 64, and generates the output voltage signal VOUT 60.

The operation of the voltage detection circuit will be explained as follows. As shown in FIG. 24, the logical voltage of the output voltage signal VOUT 60 which is obtained at the output terminal of the second NOT circuit 62 becomes "L" when the power-supply voltage VDD is less than 4V and becomes "H" when the voltage VDD is about 4V or higher under predetermined conditions.

This result is due to the following ground. The electric potential of the node N 63 is lower than the power-supply voltage VDD by the voltage drop of the P-channel type MOS transistors Qp 61–Qp 63. The electric potential becomes 2V, for example.

On the other hand, the threshold level of the first NOT circuit 61 which is composed of the P-channel type MOS transistor Qp 64 and the N-channel type MOS transistor Qn 62 is about ½ of the power-supply voltage VDD. Therefore, when the power-supply voltage VDD is about 4V, the electric potential of the node N 64 which is connected with the input terminal of the first NOT circuit 61 becomes about 2V, so that the logical voltage of the node N 64, or the voltage detection signal VDT goes from "H" to "L", and the logical voltage of the output voltage signal VOUT 60 which is the output of the second NOT circuit 62 goes from "L" to "H".

The current drain of the voltage detection circuit will be explained as follows. As shown in FIG. 24, when the power-supply voltage VDD is about 4V, the node N 63 which is the input terminal of the first NOT circuit 61 consisting of the P-channel type MOS transistor Qp 64 and the N-channel type MOS transistor Qn 62 has an intermediate electric potential between the power-supply voltage VDD and the ground voltage VSS. Consequently, both the P-channel type MOS transistor Qp 64 and the N-channel type MOS transistor Qn 62 are in the on state, that is, the first NOT circuit 61 temporarily falls into the short-circuit state. The current drain In 60 which runs through the N-channel type MOS transistor Qn 62 has a peak of 0.6 μA or so. Even when the power-supply voltage VDD is not about 4V, the current drain In 60 is 0.1 μA or higher as shown in FIG. 25.

However, in the conventional voltage detection circuit, when the electric potential of the node N 63 which is the input of the-first NOT circuit 61 has an intermediate electric potential between the power-supply voltage VDD and the ground voltage VSS, both the P-channel type MOS transistor Qp 64 and the N-channel type MOS transistor Qn 62 become the on state, that is, fall into temporary short-circuit state, which leads to an increase in the current drain. The current drain for the entire voltage detection circuit is large in other states, too.

In view of these problems, the object of the present invention is to provide a voltage detection circuit which reduces the peak of the current drain in the temporary short-circuit state and decreases the current drain as the entire circuit.

On the other hand, when a predetermined voltage is detected by the voltage detection circuit, a power-on/off reset circuit for immediately suspending the operations of the devices such as a logic circuit or a memory circuit might destroy memory data in the memory circuit when the operation is immediately suspended. Although there is no problem in the logic circuit, the memory circuit needs data re-writing (restore or refresh) after a readout. For this reason, it is difficult to properly terminate a sequence in operation.

In view of these problems, another object of the present invention is to provide a power-on/off reset circuit which properly terminates a sequence in operation.

DISCLOSURE OF THE INVENTION

The present invention includes the voltage detection circuit, power-on/off reset circuit, and semiconductor device which are constructed as follows.

The voltage detection circuit of the invention of claim 1 is characterized by comprising a first MOS transistor whose gate and drain are connected with a first node, a second MOS transistor whose gate and drain are connected with the first node and a third node, respectively, a first resistive element which is connected between the first node and a second node, a second resistive element which is connected between the second node and a ground voltage terminal, a first NOT circuit whose input terminal is connected with the second node, whose output terminal is a fourth node, and which is connected between the third node and the ground voltage terminal, and a second NOT circuit whose input terminal is connected with the fourth node and whose output terminal is a fifth node.

The voltage detection circuit of the invention of claim 2 comprises a first MOS transistor whose gate and drain are connected with a first node, a second MOS transistor whose gate and drain are connected with the first node and a third node, respectively, a first resistive element which is connected between the first node and a second node, a second resistive element which is connected between the second node and a ground voltage terminal, a first NOT circuit whose input terminal is connected with the second node and whose output terminal is a fourth node, a second NOT circuit whose input terminal is connected with the fourth node, whose output terminal is a fifth node, and which is connected between a third node and the ground voltage terminal, and a third MOS transistor whose gate is connected with the fifth node and which is connected between either the ground voltage terminal or the power-supply voltage terminal and the fourth node.

In the invention of claim 3, the first, second, and third MOS transistors of the invention of claim 2 are P-channel type MOS transistors, and the source of the third MOS transistor is connected with a power-supply voltage terminal.

The invention of claim 4 comprises a first voltage detection circuit which detects a first voltage and outputs a first signal, and a second voltage detection circuit which detects a second voltage lower than the first voltage and outputs a second signal, wherein the first voltage detection circuit comprises a first P-channel type MOS transistor whose gate and drain are connected with a first node, a second P-channel type MOS transistor whose gate and drain are connected with the first node and a third node, respectively, a first resistive element which is connected between the first node and a second node, a second resistive element which is connected between the second node and a ground voltage, a NOT circuit whose input terminal is the second node, whose output terminal is a fourth node, and which is connected between the third node and the ground voltage terminal, and a third MOS transistor which is connected between either the ground voltage terminal or a power-supply voltage terminal and the fourth node and whose gate is applied with the second signal of the second voltage detection circuit.

The invention of claim 5 is characterized in that in the invention of claim 4, the second signal which is outputted from the second voltage detection circuit is outputted only when the power supply is turned on.

The invention of claim 6 has a construction that in the invention of claim 4 the second signal which is outputted from the second voltage detection circuit is outputted for a certain time period after the power supply is turned on.

The voltage detection circuit of the invention of claim 7 comprises a first P-channel type MOS transistor whose gate and drain are connected with a first node, a second P-channel type MOS transistor whose gate and drain are connected with the first node and a third node, respectively, a first resistive element which is connected between the first node and a second node, a second resistive element which is connected between the second node and a ground voltage terminal, an N-channel type MOS transistor whose gate is connected with the second node, and a first NOT circuit whose input is the third node and whose output is a fourth node.

The invention of claim 8 has a construction that in the invention of claim 7 the first resistive element is an N-channel type MOS transistor.

The power-on/off reset circuit of the invention of claim 9 comprises a first voltage detection circuit which detects a first voltage and outputs a first signal, and prevents a new operational sequence when a power-supply voltage is equal to or lower than the first voltage.

The power-on/off reset circuit of the invention of claim 12 comprises a first voltage detection circuit which detects a first voltage and outputs a first signal, and a second voltage detection circuit which detects a second voltage lower than the first voltage and outputs a second signal, prevents a new operational sequence when a power-supply voltage is equal to or lower than the first voltage, and immediately suspends an operation when the power-supply voltage is equal to or lower than the second voltage.

The power-on/off reset circuit of the invention of claim 13 comprises a first voltage detection circuit which detects a first voltage and outputs a first signal, and a second voltage detection circuit which detects a second voltage lower than the first voltage and outputs a second signal, wherein a time for a power-supply voltage to drop from the first voltage to the second voltage is longer than a predetermined operational sequence completion time.

The voltage detection circuit of claim 14 comprises a first voltage detection circuit which (a) detects a first voltage and outputs a first signal, (b) outputs the first signal only when the power supply is turned on, and (c) outputs the first signal for a certain time period after the power supply is turned on, a second voltage detection circuit which detects a second voltage and outputs a second signal, a third voltage detection circuit which detects a third voltage higher than the second voltage, a fourth voltage detection circuit which detects a fourth voltage higher than the third voltage and outputs a fourth signal, a signal selection circuit which selects either the third signal or the fourth signal and outputs a fifth signal, a first control circuit which generates an OR output of the first signal and the second signal, and a second control circuit which generates an OR output of the first signal and the fifth signal.

The power-on/off reset circuit of claim 15 comprises a voltage detection circuit which detects a first voltage and a second voltage higher than the first voltage and outputs a first signal, wherein the first signal is transmitted at the second voltage when a power-supply voltage rises, and transmitted at the first voltage when the power-supply voltage drops, and a new operational sequence is prevented when the power-supply voltage is equal to or lower than the voltage for the first signal to be transmitted.

The power-on/off reset circuit of claim 16 comprises a first voltage detection circuit which detects a first voltage and a second voltage higher than the first voltage and outputs a first signal, and a second voltage detection circuit which detects a third voltage which is lower than the first voltage and outputs a second signal, wherein the first signal is transmitted at the second voltage when a power-supply voltage rises, and transmitted at the first voltage when the power-supply voltage drops, a new operational sequence is prevented when the power-supply voltage is equal to or lower than the voltage for the first signal to be transmitted, and an operation is immediately suspended when the power-supply voltage is equal to or lower than the third voltage.

The power-on/off reset circuit of claim 17 comprises a first voltage detection circuit which detects a first voltage and a second voltage higher than the first voltage, and outputs a first signal, and a second voltage detection circuit which detects a third voltage which is lower than the first voltage and outputs a second signal, wherein the first signal is transmitted at the second voltage when a power-supply voltage rises, and transmitted at the first voltage when the power-supply voltage drops, and a time for a power-supply voltage to drop from the first voltage to the third voltage is longer than a predetermined operational sequence completion time.

The semiconductor of the invention of claim 18 comprises the power-on/off reset circuit of claim 9 and a non-volatile memory, and the semiconductor does not operate the non-volatile memory when the power-supply voltage is equal to or lower than the first voltage of claim 9.

The semiconductor of the invention of claim 19 comprises the power-on/off reset circuit of claim 12 and a non-volatile memory, and the semiconductor does not operate the non-volatile memory when the power-supply voltage is equal to or lower than the second voltage of claim 12.

The semiconductor of the invention of claim 20 comprises the power-on/off reset circuit of claim 15 and a non-volatile memory, and the semiconductor does not operate the non-volatile memory when the power-supply voltage is equal to or lower than the voltage for the first signal of claim 15 to be transmitted or equal to or lower than the third voltage.

The semiconductor of the invention of claim 21 comprises the power-on/off reset circuit of claim 16 and a non-volatile memory, and the semiconductor does not operate the non-volatile memory when the power-supply voltage is equal to or lower than the voltage for the first signal of claim 12 to be transmitted or equal to or lower than the third voltage.

The inventions of claims 1–8 and 14 are voltage detection circuits which reduce the peak of the current drain and obtain a stable voltage detection signal. There is another effect that the stable voltage detection signal can be obtained even at a low voltage of turning on the power-supply.

The inventions of claims 9, 12, and 13 are power-on/off reset circuits which have an effect of not starting a new operational sequence mistakenly when the power supply is turned on, and properly terminating a sequence in operation when the power supply is turned off.

The inventions of claims 15, 16, and 17 have an effect of obtaining an operation stable against the fluctuation of the power-supply voltage by applying voltage hysteresis to the power-on/off reset voltage.

The inventions of claims 18, 19, 20, and 21 have an effect of obtaining an operation stable against the fluctuation of the power-supply voltage by applying voltage hysteresis to the power-on/off reset voltage, thereby preventing the wrong operation of the non-volatile memory which is under the control of this signal.

DESCRIPTION OF REFERENCE NUMBERS

| | |
|---|---|
| Qp 11–Qp 64 | P-channel type MOS transistors |
| Qn 11–Qn 62 | N-channel type MOS transistors |
| VDD | power-supply voltage |
| VSS | ground voltage |

-continued

| 11–31 | NOT circuits |
| N 11–N 64 | nodes |
| VDT 10–VDT 60 | voltage detection signals |
| VOUT 10–VOUT 60 | output voltage signals |
| In 10–In 60 | current drain |
| BL, /BL | bit lines and their signals |
| WO 0–WL 255 | word lines and their signals |
| CO 0–CP 255 | cell plate electrodes and their signals |
| BP | bit line pre-charge control signal |
| SAE | sense amplifier control signal |

PREFERRED EMBODIMENTS OF THE INVENTION

The entire disclosures of U.S. patent application Ser. No. 09/198,726, filed Nov. 24, 1998 and U.S. patent application Ser. No. 08/817,746, filed Jul. 9, 1997 are expressly incorporated by reference herein.

The embodiments of the present invention will be explained hereinafter.

Embodiment 1

Figure 1:
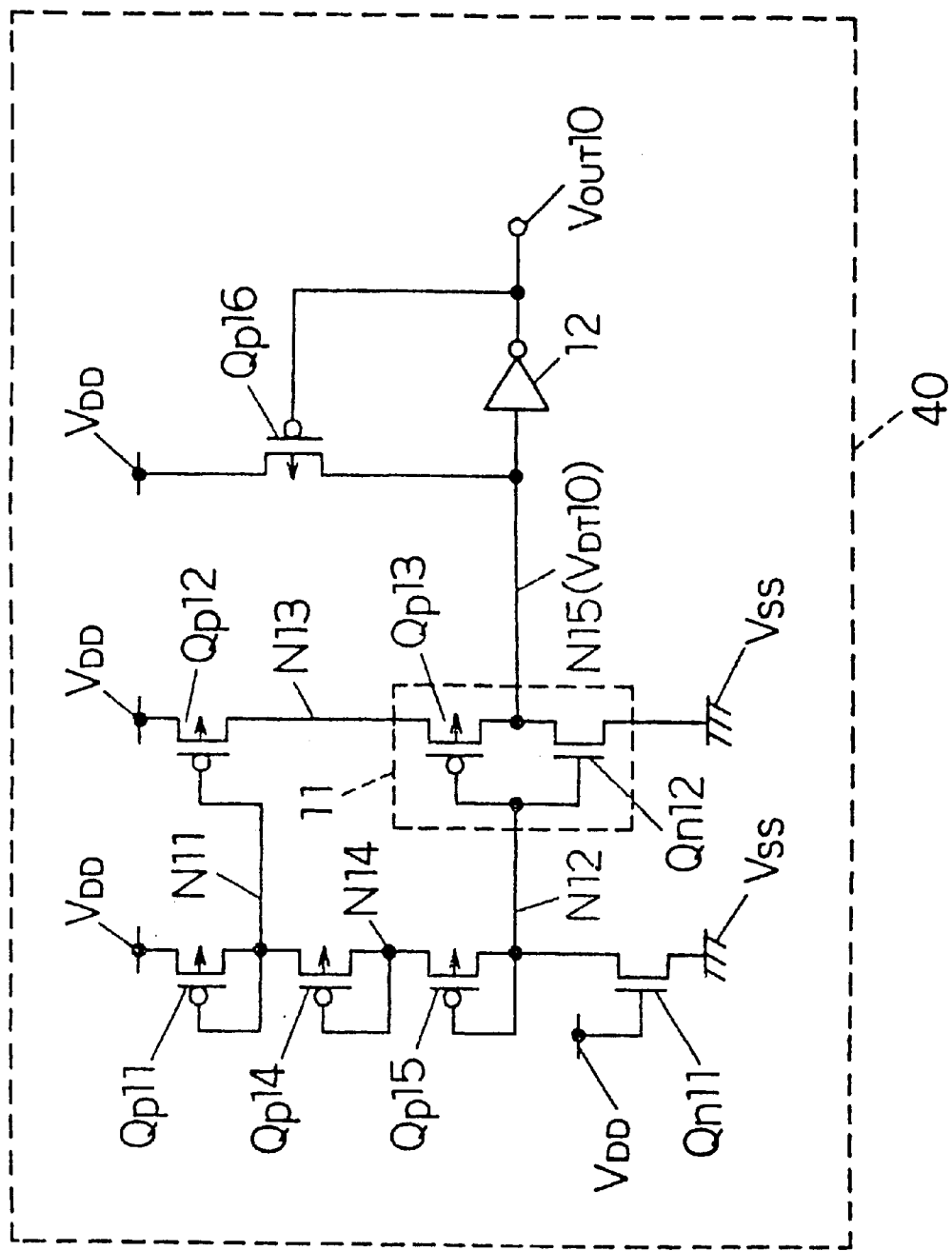
FIG. 1 shows the construction of the voltage detection circuit of the first embodiment of the present invention.
Figure 2:
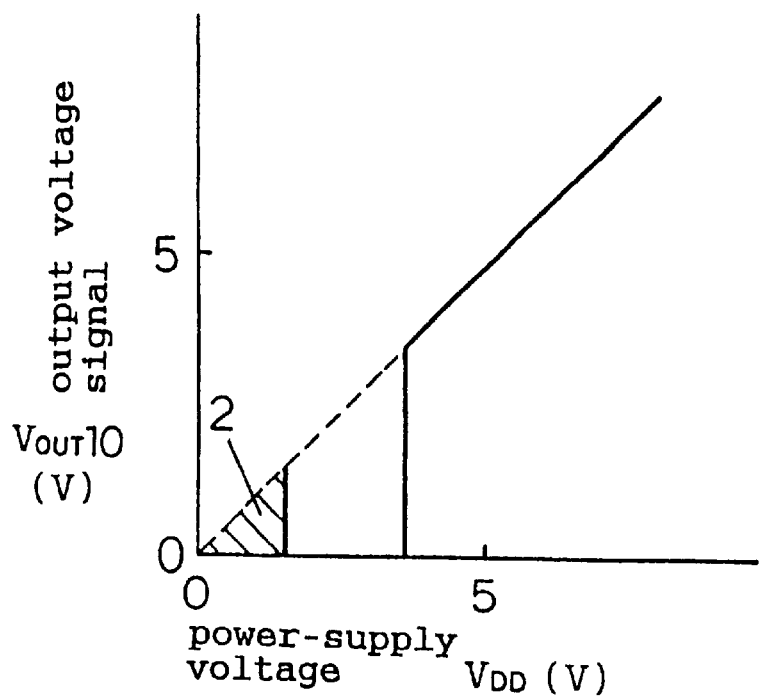
FIG. 2 shows the relationship between the power-supply voltage and the output voltage signal of the first embodiment of the present invention.
Figure 3:
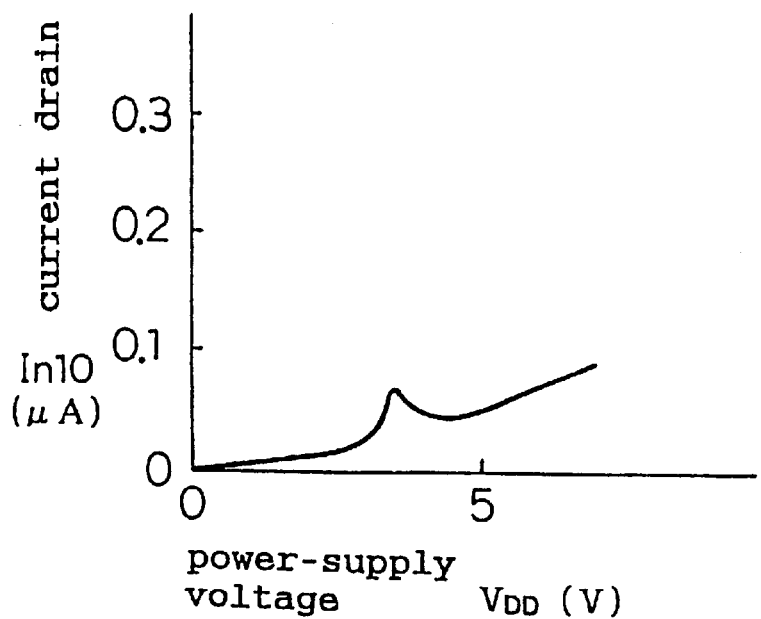
FIG. 3 shows the relationship between the power-supply voltage and the current drain of the first embodiment of the present invention.

FIG. 1 shows the construction of the voltage detection circuit of the first embodiment of the present invention (corresponding to claims 1, 2, and 3). FIG. 2 shows the relationship between the power-supply voltage and the output voltage signal, and FIG. 3 shows the relationship between the power-supply voltage and the current drain.

The construction of the present embodiment will be explained hereinafter. In FIG. 1, Qp 11–Qp 16 are P-channel type MOS transistors, Qn 11 and Qn 12 are N-channel type MOS transistors, and 11 and 12 are NOT circuits.

The source of the P-channel type MOS transistor Qp 11 is connected with the power-supply voltage VDD, and its gate and drain are connected with the node N 11. The source of the P-channel type MOS transistor Qp 12 is connected with the power-supply voltage VDD, and its gate and drain are connected with the node N 11 and the node N 13, respectively. The P-channel type MOS transistors Qp 14 and Qp 15 are connected with each other in series between the nodes N 11 and N 12. The N-channel type MOS transistor Qn 11 is connected between the node N 12 and the ground voltage VSS. The serially-connected P-channel type MOS transistors Qp 14 and Qp 15 and the N-channel type MOS transistor Qn 11 serve as resistive elements. A NOT circuit 11 whose input terminal is the node N 12 and whose output terminal is the node N 15 is connected between the node N 13 and the ground voltage VSS. The NOT circuit 11 is made by serially connecting the P-channel type MOS transistor Qp 13 and the N-channel type MOS transistor Qn 12. The input terminal of the NOT circuit 12 is connected with the node N 15 and the output terminal of the NOT circuit 12 outputs a signal VOUT 10. A P-channel type MOS transistor Qp 16 whose gate is supplied with the signal VOUT 10 is connected between the node N 15 and the power-supply voltage VDD.

As shown in FIG. 2, the present embodiment is so designed that when the power-supply voltage VDD is about 3.5V or below, the logical voltage of the output of the signal VOUT 10 becomes "L", and when the power-supply voltage is about 3.5V or above, the logical voltage becomes "H".

With regard to the current drain of the present embodiment, as shown in FIG. 3, when the power-supply voltage VDD is about 3.5V, the electric potential of the second node N 12 becomes intermediate between the ground voltage VSS and the third node N 13. Consequently, both the P-channel type MOS transistor Qp 13 and the N-channel type MOS transistor Qn 12 are in the on state, that is, the first NOT circuit 11 falls into a temporary short-circuit state, in which the current value becomes the highest. However, the increase in the current value is reduced by the P-channel type MOS transistor Qp 12, so that the current drain In 10 which runs through the transistor Qn 12 has its peak at 0.05 μA. Even when the power-supply voltage is not about 3.5V, the current drain In 10 does not exceeds 0.1 μA.

Since the current value of the P-channel type MOS transistor Qp 12 becomes about the same as the current value of the P-channel type MOS transistor Qp 11, the current which goes to the P-channel type MOS transistors Qp 11 and Qp 12 can be reduced by increasing the resistance value.

The current drain Ip 10 of the P-channel type MOS transistor Qp 12 can be further reduced by making the driving ability of the P-channel type MOS transistor Qp 12 equal to or lower than the driving ability of the P-channel type MOS transistor Qp 11.

Thus, in the present invention, the current drain can be reduced at 0.1 μA or below within the operational power-supply voltage.

Furthermore, the P-channel type MOS transistor Qp 16 makes the node N 15 be in the latch state, thereby stabilizing the signal VOUT 10.

Embodiment 2

Figure 4:
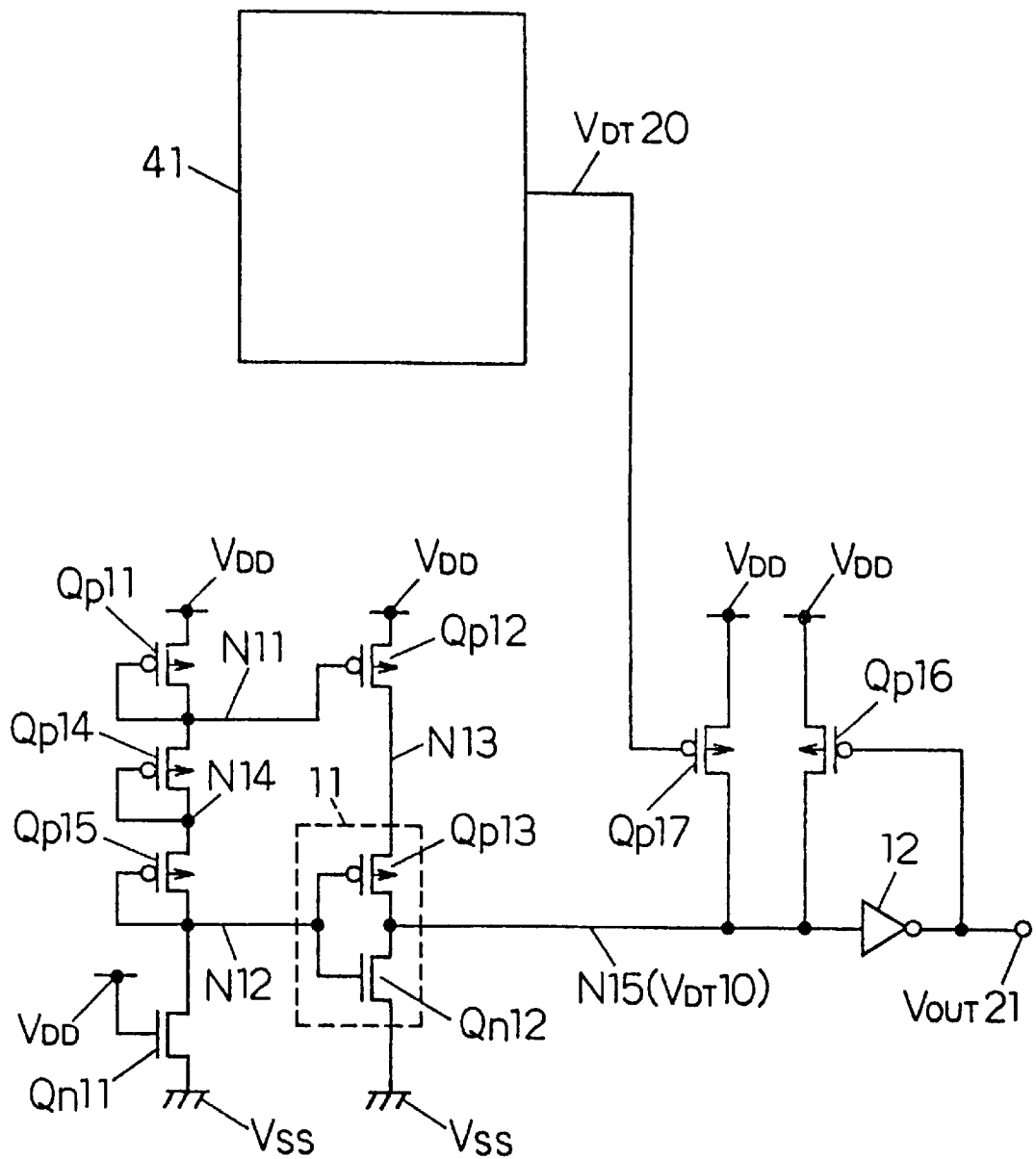
FIG. 4 shows the construction of the voltage detection circuit of the second embodiment of the present invention.

FIG. 4 shows the construction of the voltage detection circuit of the second embodiment of the present invention (corresponding to claim 4).

In the present embodiment, a voltage detection circuit 41 which can detect a lower voltage than in the first embodiment is added, the output signal VDT 20 whose logical voltage is "H" is supplied to the gate of the P-channel type MOS transistor Qp 17 at the low voltage of the voltage detection circuit 41, and this transistor Qp 17 is connected between the node N 15 and the power-supply voltage VDD. The present embodiment can prevent the circuit of FIG. 1 from becoming unstable at around 1.5V shown in FIG. 2.

As a result, this circuit can achieve a stable operation at a low voltage especially when the power supply is turned on, by means of a signal from a voltage detection circuit which detects a lower voltage than the voltage of the circuit itself.

Embodiment 3

Figure 5:
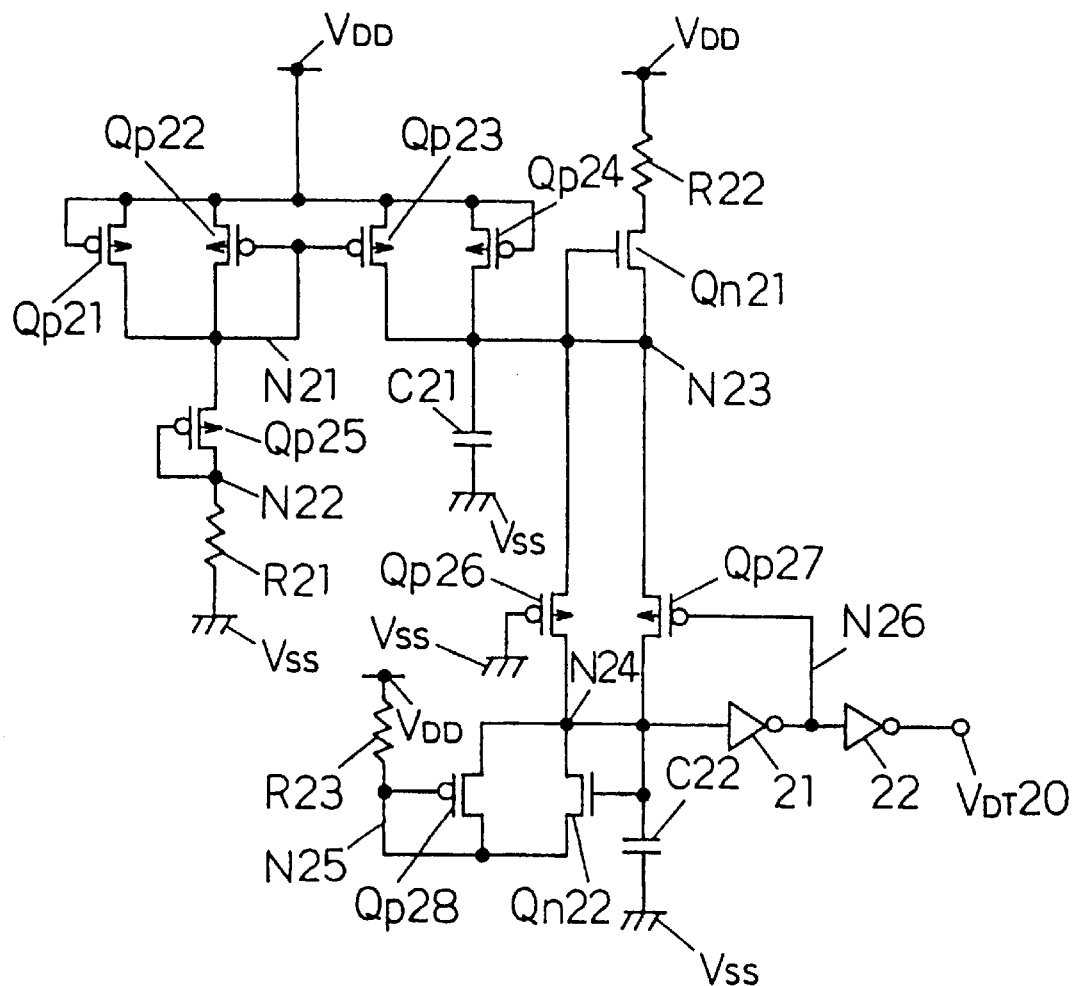
FIG. 5 shows the construction of the voltage detection circuit of the third embodiment of the present invention.
Figure 6:
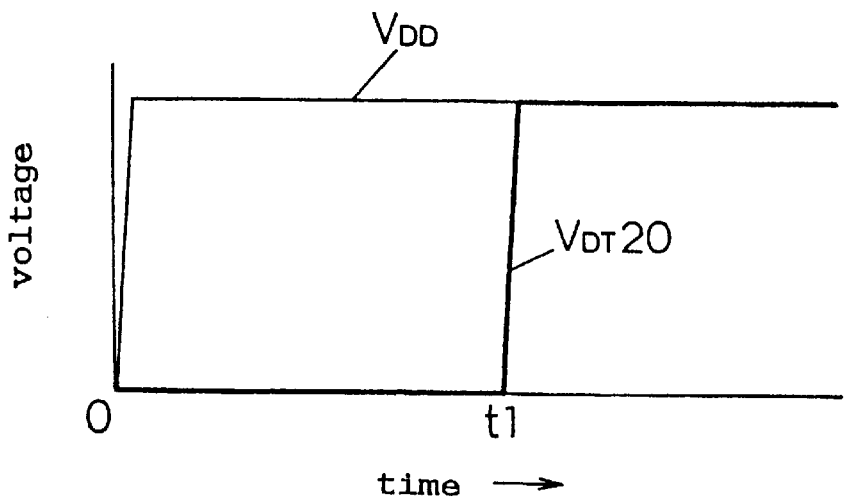
FIG. 6 shows the waveform of the output signal when the power supply is turned on of the third embodiment of the present invention.

FIG. 5 shows the construction of the voltage detection circuit of the third embodiment of the present invention (corresponding to claims 5 and 6), and FIG. 6 shows the waveform of the output signal when the power supply is turned on.

The present embodiment can be used in the voltage detection circuit 41 of the second embodiment.

The sources of the P-channel type MOS transistors Qp 21–Qp 24, the gates of the transistors Qp 21 and Qp 24 are connected with the power-supply voltage VDD. The drains of the transistors Qp 21–Qp 22 and the gates of the transistors Qp 22–Qp 23 are connected with the node N 21. The drains of the transistors Qp 23–Qp 24 are connected with the node N 23. The source of the P-channel type MOS transistor Qp 25 is connected with the node N 21, and its gate and drain are connected with the node N 22. A resistance R 21 is connected between the node N 22 and the ground voltage VSS. The N-channel type MOS transistor Qn 21 whose gate is the node N 23 is connected between the power-supply voltage VDD and the node N 23 via the resistance R 22. The capacity C 21 is connected between the node N 23 and the ground voltage VSS. The P-channel type MOS transistor Qp 26 whose gate is the ground voltage VSS and the P-channel type MOS transistor Qp 27 whose gate is the node N 26 are connected with each other in parallel between the nodes N 23 and N 24. The NOT circuit 21 whose input is the node N 24 and whose output is the node N 26 is connected in serial with the NOT circuit 22 whose input is the node N 26 and whose output is the signal VDT 20. The capacity C 22 is connected between the node N 24 and the ground voltage VSS. The gate and source of the N-channel type MOS transistor Qn 22 are connected with the node N 24 and its drain is connected with the node N 25. The source of the P-channel type MOS transistor Qp 28 is connected with the node N 24 and its gate and drain are connected with the node N 25. The resister R 23 is connected between the node N 25 and the power-supply voltage VDD.

In this circuit, the node N 23 which is connected with the capacity C 21 is supplied with charges via the P-channel type MOS transistor Qp 23 whose current is restricted. The node N 23 can be regarded as a voltage source whose voltage rises slowly. The NOT circuit 21 receives the voltage of the node N 24 which is determined by the charge supply from the node N 23 and outputs the voltage to the node N 26. The node N 22 receives the voltage and outputs the voltage detection signal VDT 20. The switching voltage level of the NOT circuit 21 is set high. Since the voltage of the node N 23 rises slowly, the voltage detection signal VDT 20 increases t1 time after the power-supply voltage VDD is turned on as shown in FIG. 6. The time t1 is determined by the current ability between the capacity C 21 and the P-channel type MOS transistor Qp 23 and the current ability between the capacity C 22 and the P-channel type MOS transistor Qp 26.

This circuit is characterized in that the voltage detection signal VDT 20 is outputted when the power-supply voltage is turned on, but not outputted when the power-supply voltage is turned off.

The use of the present embodiment as a voltage detection circuit or a power-on/off reset circuit for the voltage detection circuit 41 of the second embodiment makes it possible to realize a stable operation when the power supply is turned on.

Embodiment 4

Figure 7:
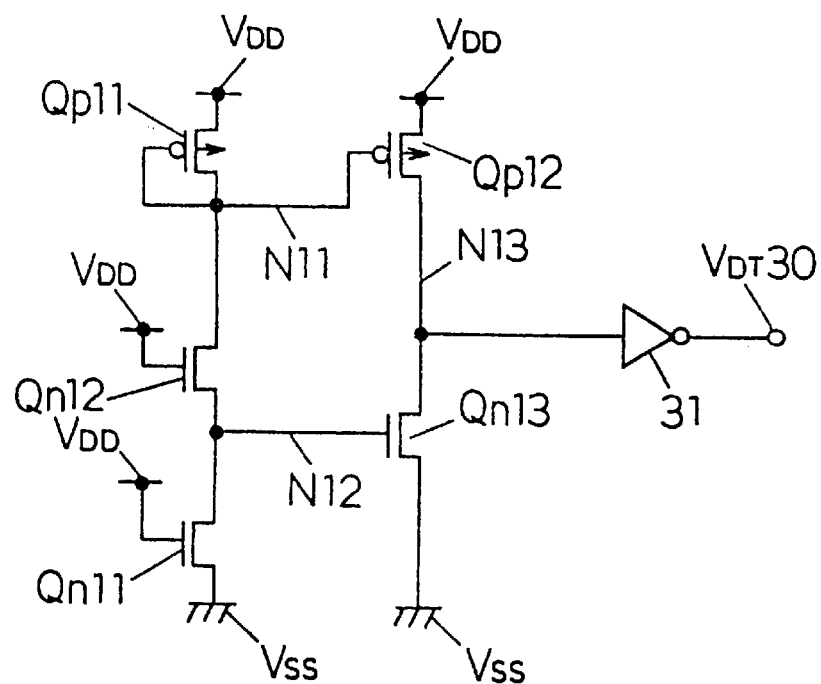
FIG. 7 shows the construction of the voltage detection circuit of the fourth embodiment of the present invention.
Figure 8:
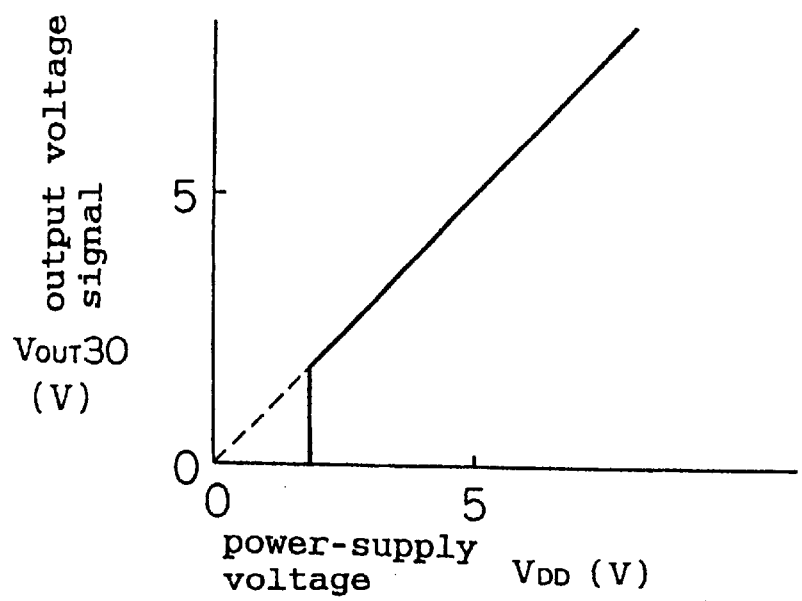
FIG. 8 shows the relationship between the power-supply voltage and the output voltage signal of the fourth embodiment of the present invention.

FIG. 7 shows the construction of the voltage detection circuit of the fourth embodiment of the present invention (corresponding to claims 7 and 8), and FIG. 8 shows the relationship between the power-supply voltage and the output voltage signal.

Firstly, the construction of the present embodiment will be explained as follows. In FIG. 7, Qp 11 and Qp 12 are P-channel type MOS transistors, Qn 11–Qn 13 are N-channel type MOS transistors, and 31 represents a NOT circuit.

The source of the P-channel type MOS transistor Qp 11 is connected with the power-supply voltage VDD, and its gate and drain are connected with the node N 11. The source of the P-channel type MOS transistor Qp 12 is connected with the power-supply voltage VDD, and its gate and drain are connected with the node N 11 and the node N 13, respectively. The N-channel type MOS transistor Qn 12 is connected between the node N 11 and the node N 12. The N-channel type MOS transistor Qn 11 is connected between the node N 12 and the ground voltage VSS. The N-channel type MOS transistor Qn 13 whose gate is the node N 12 is connected between the node N 13 and the ground voltage VSS. The input terminal of the NOT circuit 31 is connected with the node N 13, and the output terminal thereof outputs the signal VOUT 30.

As shown in FIG. 8, the present embodiment so operates that the logical voltage of the operation signal VOUT 30 becomes "L" when the power-supply voltage VDD is about less than 2.0V and becomes "H" when the power-supply voltage VDD is about 2.0V or above.

In the present embodiment, the power-supply voltage VDD is lowered by the threshold value of the P-channel type MOS transistor Qp 11, and divided between N-channel type MOS transistors Qn 12 and Qn 11. The divided voltage is outputted to the node N 12. The voltage of the node N 12 makes the N-channel type MOS transistor Qn 13 be turned on and off, thereby determining the signal VOUT 30. Thus, the detection signal with a low voltage can be obtained by dividing the power-supply voltage between N-channel type MOS transistors Qn 12 and Qn 11. Another voltage detection signal can be obtained by changing the voltage division ratio between the N-channel type MOS transistors Qn 12 and Qn 11 or providing an additional node which offers a divided voltage different from the node N 12 by connecting another N-channel type MOS transistor with the transistors Qn 12 and Qn 11 in series. Furthermore, the circuit may-be so constructed that the ability of the N-channel type MOS transistor Qn 12 can be renewed by replacing its fuse or the like. The present embodiment does not demand large power consumption, and is applicable to the circuit 41 of the second embodiment.

Embodiment 5

Figure 9:
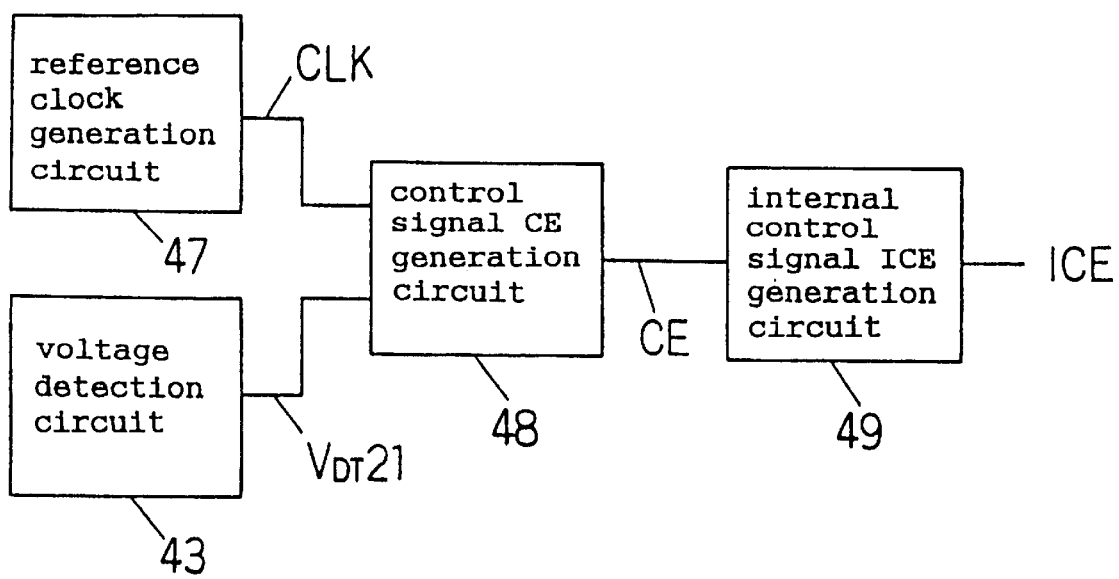
FIG. 9 shows the construction of the power-on/off reset circuit of the fifth embodiment of the present invention.
Figure 10:
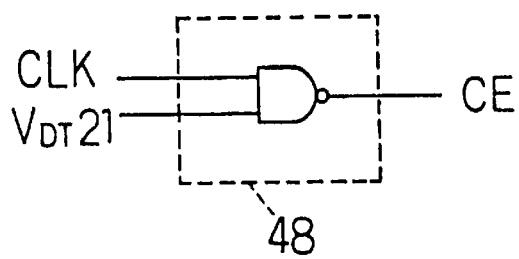
FIG. 10 shows the construction of the power-on/off reset circuit of the fifth embodiment of the present invention.
Figure 11:
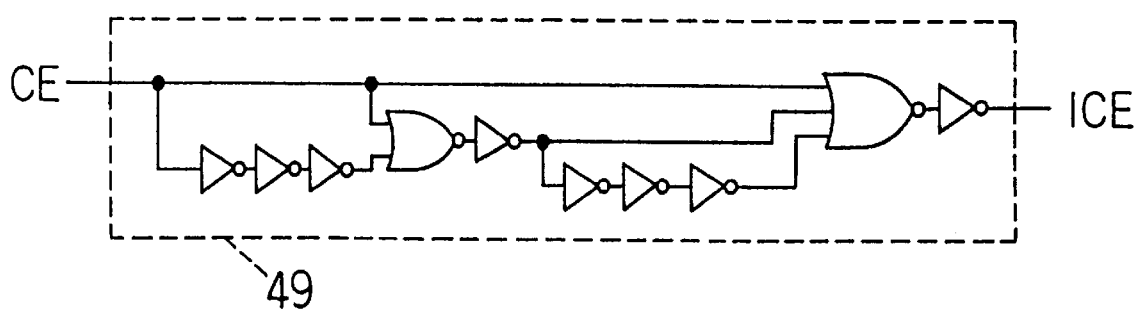
FIG. 11 shows the construction of the power-on/off reset circuit of the fifth embodiment of the present invention.
Figure 12:
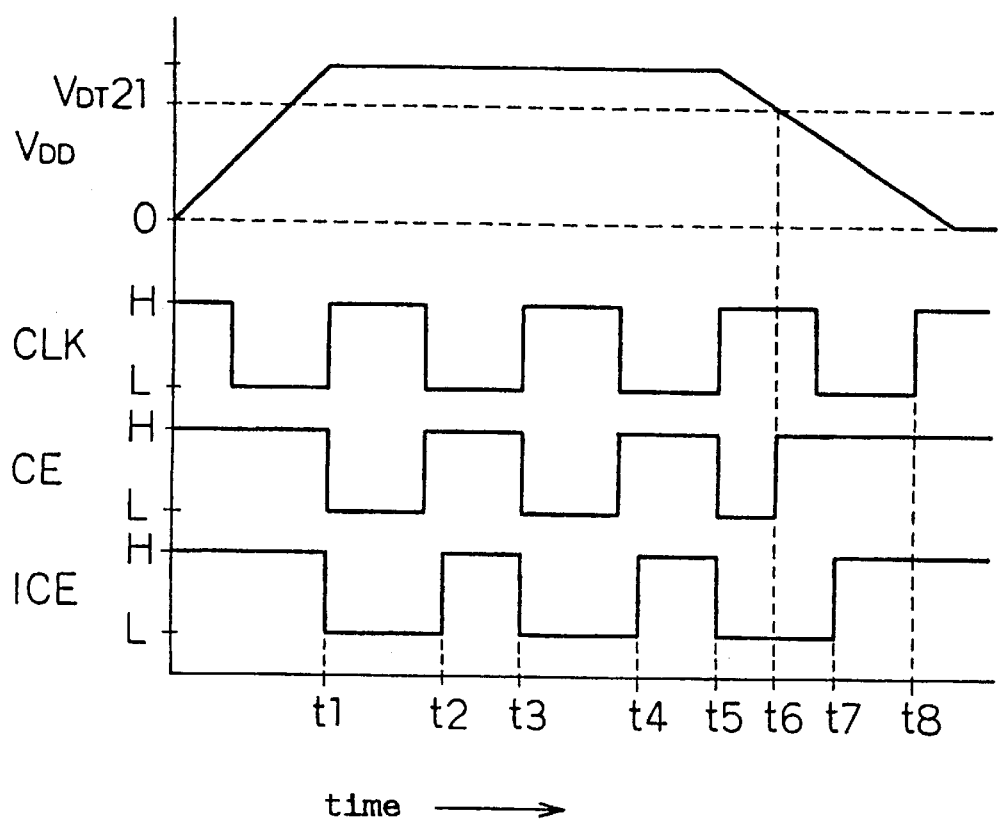
FIG. 12 shows the operational timing chart of the power-on/off reset circuit of the fifth embodiment of the present invention.

FIGS. 9, 10, and 11 show the construction of the power-on/off reset circuit of the fifth embodiment of the present invention (corresponding to claim 9). FIG. 12 shows the timing chart of the operation. In the drawings, VDD, CLK, CE, and ICE represent a power-supply voltage, a reference clock, a control signal, and an internal control signal, respectively.

The present embodiment is composed of a voltage detection circuit 43 which outputs a voltage detection signal VDT 21, a reference clock generation circuit 47 which outputs a reference clock CLK, a control signal CE generation circuit 48 which outputs a control signal CE from the voltage detection signal VDT 21 and the control signal (sic.) CLK, and an internal control signal ICE generation circuit 49 which outputs an internal control signal ICE from the control signal CE. The present embodiment prevents a new operational sequence when the voltage is equal to or lower than the voltage which is detected by the voltage detection signal VDT 21, and completes an on-going sequence.

When the power-supply voltage is equal to or higher than the voltage which is detected by the voltage detection signal VDT 21, the control signal CE has the reversed phase of the reference clock CLK. On the other hand, when the power-supply voltage is lower than the voltage which is detected by the voltage detection signal VDT 21, the control signal CE has a logical voltage of "H". FIG. 11 shows a circuit which makes an on-going sequence be completed, and generates a pulse signal which has a certain delay time from the trailing edge of the control signal CE.

When the power-supply voltage is equal to or higher than the voltage which is detected by the voltage detection signal VDT 21, the internal control signal ICE has the same waveform as the external input control signal CE. When the power-supply voltage becomes lower than the voltage detection signal VDT 21 at time t6, the logical voltage of the internal control signal ICE is kept at "L" even if the logical voltage of the external input control signal CE becomes "H", and goes to "H" at time t6 (sic.). Even when the logical voltage of the external input control signal CE becomes "L" at t8, the logical voltage of the internal control signal ICE is kept at "H".

In the power-on/off reset of this operation, an on-going sequence can be completed even if the power supply is decreased, and a new operational sequence can be prevented. Consequently, the circuit can be used for a strong dielectric memory which is a non-volatile memory demanding re-writing of data.

Embodiment 6

Figure 13:
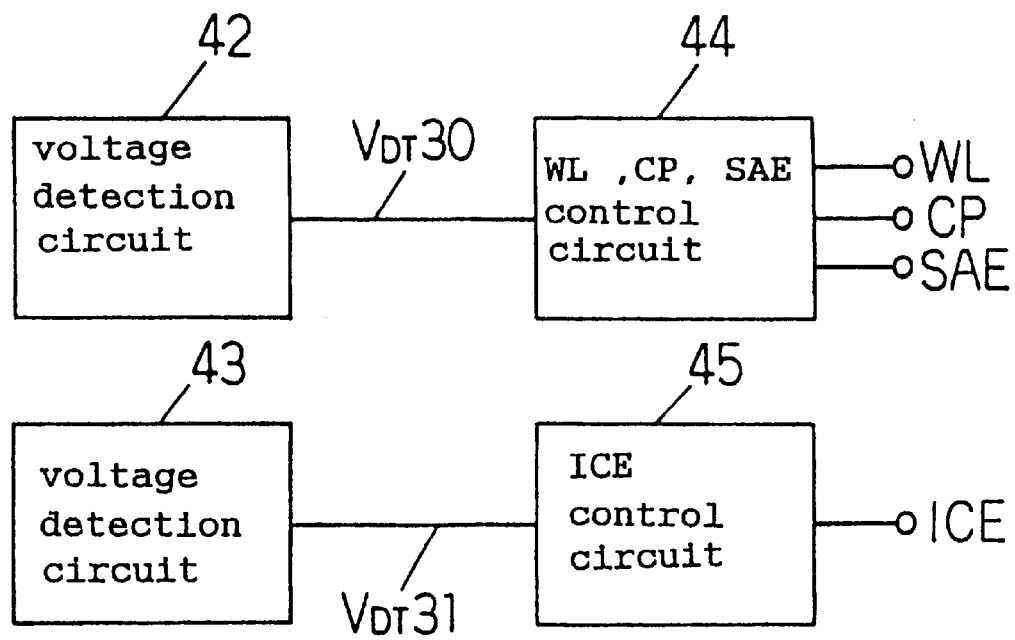
FIG. 13 shows the construction of the power-on/off reset circuit of the sixth embodiment of the present invention.
Figure 14:
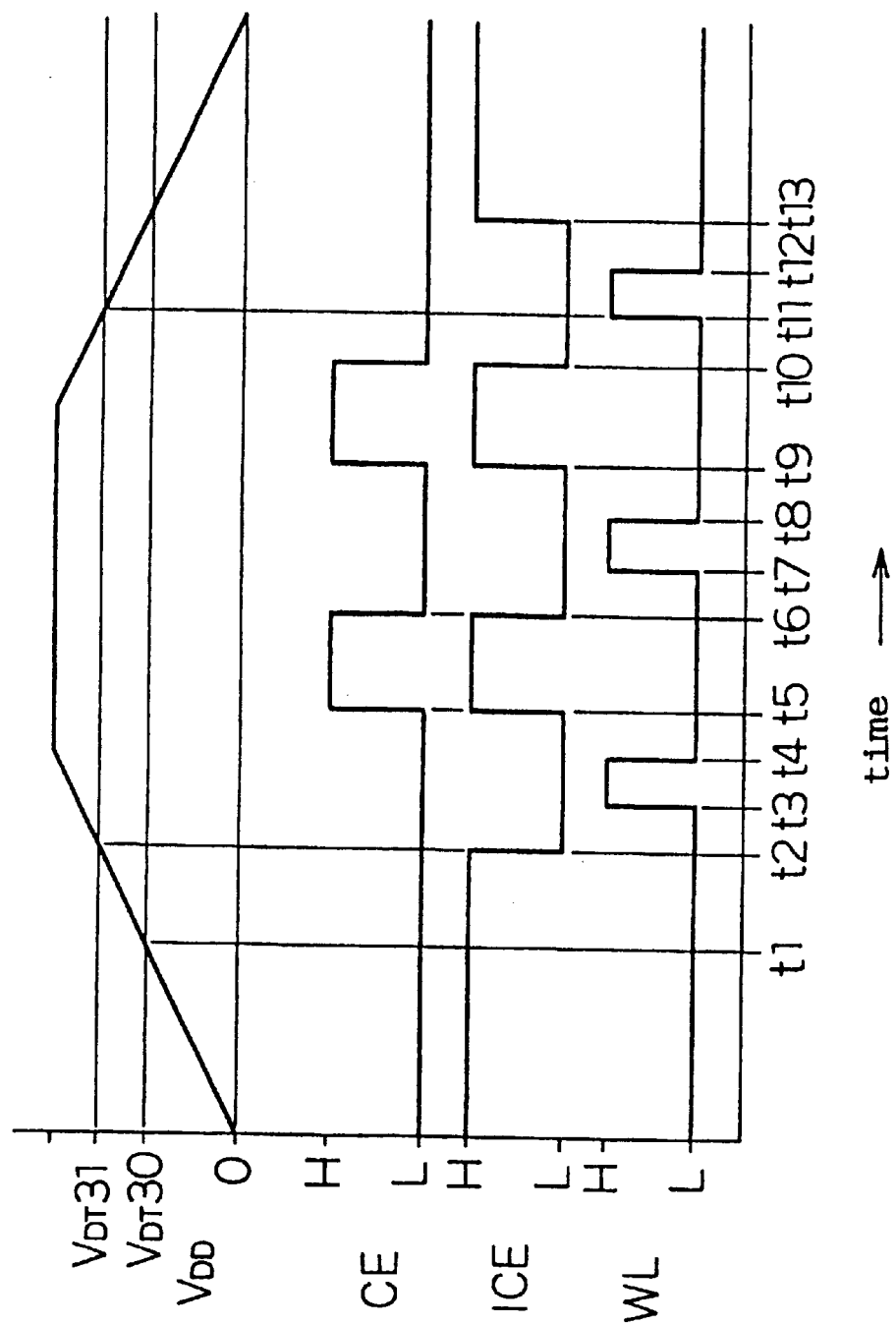
FIGS. 14 shows the operational timing chart of the sixth embodiment of the present invention.
Figure 15:
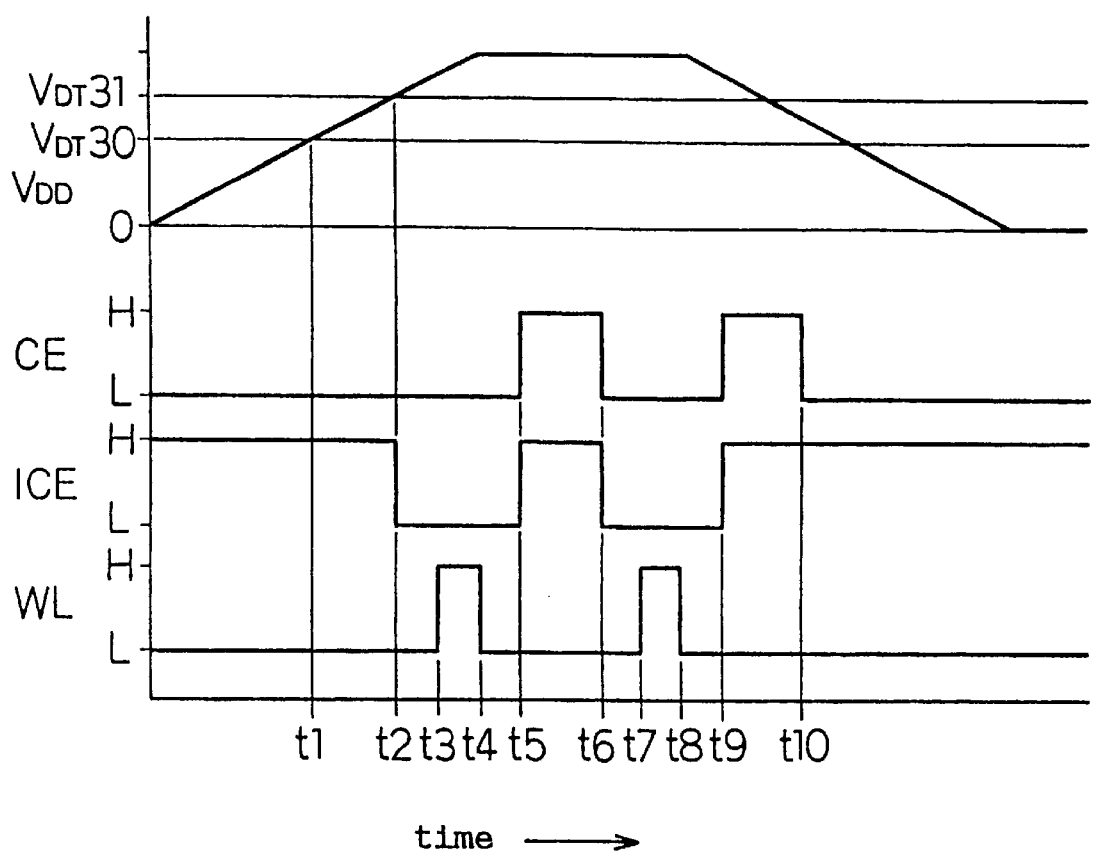
FIG. 15 shows the operational timing chart of the sixth embodiment of the present invention.

FIG. 13 shows the construction of the power-on/off reset circuit of the sixth embodiment of the present invention (corresponding to claims 12 and 13), and FIGS. 14 and 15 show the timing chart of the operation.

The present embodiment includes two voltage detection circuits 42 and 43 which output voltage detection signals VDT 30 and VDT 31, respectively. The voltage detection signal VDT 30 detects a lower voltage than the voltage detection signal VDT 31. A new operational sequence is prevented when the voltage is equal to or lower than the voltage which is detected by the voltage detection signal VDT 31 (t10 in FIG. 15), and the operation is immediately suspended when the voltage is equal to or lower than the voltage which is detected by the voltage detection signal VDT 30 (t13 in FIG. 14). Furthermore, a certain time period is secured for an on-going sequence to be completed before the power-supply voltage drops from the voltage detection signal VDT 31 to the voltage detection signal VDT 30.

In this circuit, the voltage detection signal VDT 30 of the voltage detection circuit 42 controls a WL (word line signal) •CP (cell plate line signal) •SAE (sense amplifier enable signal) control circuit 44, while the voltage detection signal VDT 31 of the voltage detection circuit 43 controls ICE (internal control signal) control circuit 45.

In FIG. 14, VDD, CE, ICE, and WL represent a power-supply voltage, an external input control signal, an internal control signal, and a word line signal, respectively. When the power-supply voltage VDD is equal to or higher than the voltage which is detected by the voltage detection signal VDT 31, the internal control signal ICE operates the same way as the external input control signal CE. When the power-supply voltage VDD becomes equal to the voltage detection signal VDT 31 at time t11, even if the logical voltage of the external input control signal CE is at "L", when the power-supply voltage VDD becomes equal to or lower than the voltage detection signal VDT 30, the internal control signal ICE keeps it logical voltage at "L" until time t13, and then goes to "H". When the power-supply voltage VDD becomes equal to or lower than the voltage detection signal VDT 30, the word line signal WL immediately suspends the operation. Therefore, the logical voltage of the word line signal WL is set at "L" without fail when the power supply is turned on and in other conditions, which prevents the wrong operation of the memory cell in a strong dielectric memory.

Embodiment 7

Figure 16:
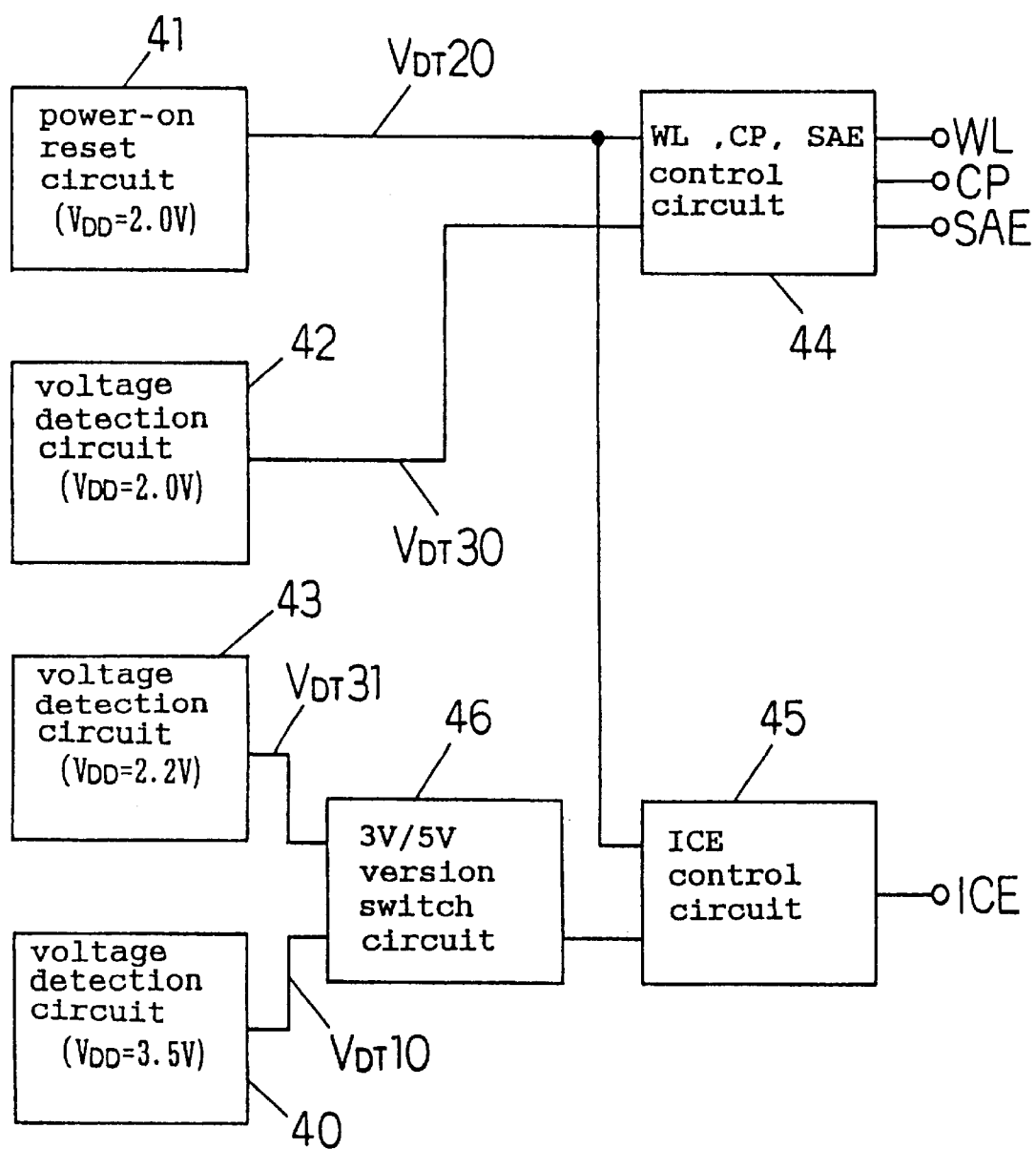
FIG. 16 shows the construction of the power-on/off reset circuit of the seventh embodiment of the present invention.

FIG. 16 shows the construction of the power-on/off reset circuit of the seventh embodiment of the present invention (corresponds to claim 14). The present embodiment is composed of the power-on reset circuit 41 of the third embodiment which outputs the voltage detection signal VDT 20, the voltage detection circuits 42 and 43 of the fourth embodiment which output the voltage detection signals VDT 30 and VDT 31, respectively, the voltage detection circuit 40 of the first embodiment which outputs the voltage detection signal VDT 10, a 3V/5V version switch circuit 46, the WL (word line signal) •CP (cell plate line signal) •SAE (sense amplifier enable signal) control circuit 44, and the ICE (internal control signal) control circuit 45. The control circuit 44 is controlled by, for example, an OR signal of the voltage detection signals VDT 20 and VDT 30, and either the voltage detection signal VDT 31 or VDT 10 is selected by the 3V/5V version switch circuit 46. For example, the voltage detection signal VDT 31 is selected in the 3V version device, and the voltage detection signal VDT 10 is selected in the 5V version device. The control circuit 45 is controlled by the OR signal of the selected signal and the voltage detection signal VDT 20. The present embodiment is an application of the above-described embodiments, and can use both the 3V version and 5V version devices, thereby completely protecting data when the power supply is turned on or off in a non-volatile memory such as a strong dielectric memory.

Embodiment 8

Figure 17:
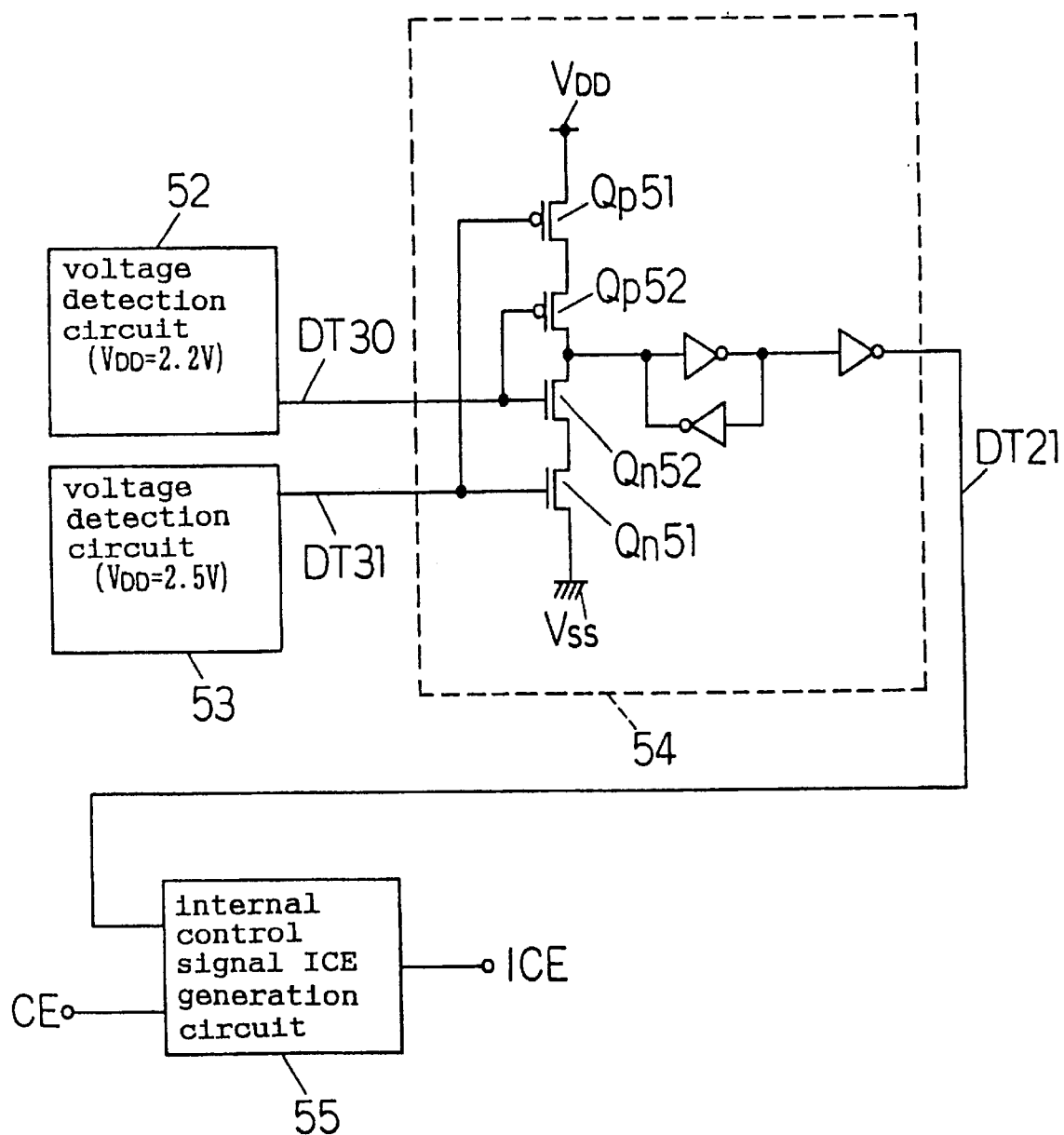
FIG. 17 shows the construction of the power-on/off reset circuit of the eighth embodiment of the present invention.
Figure 18:
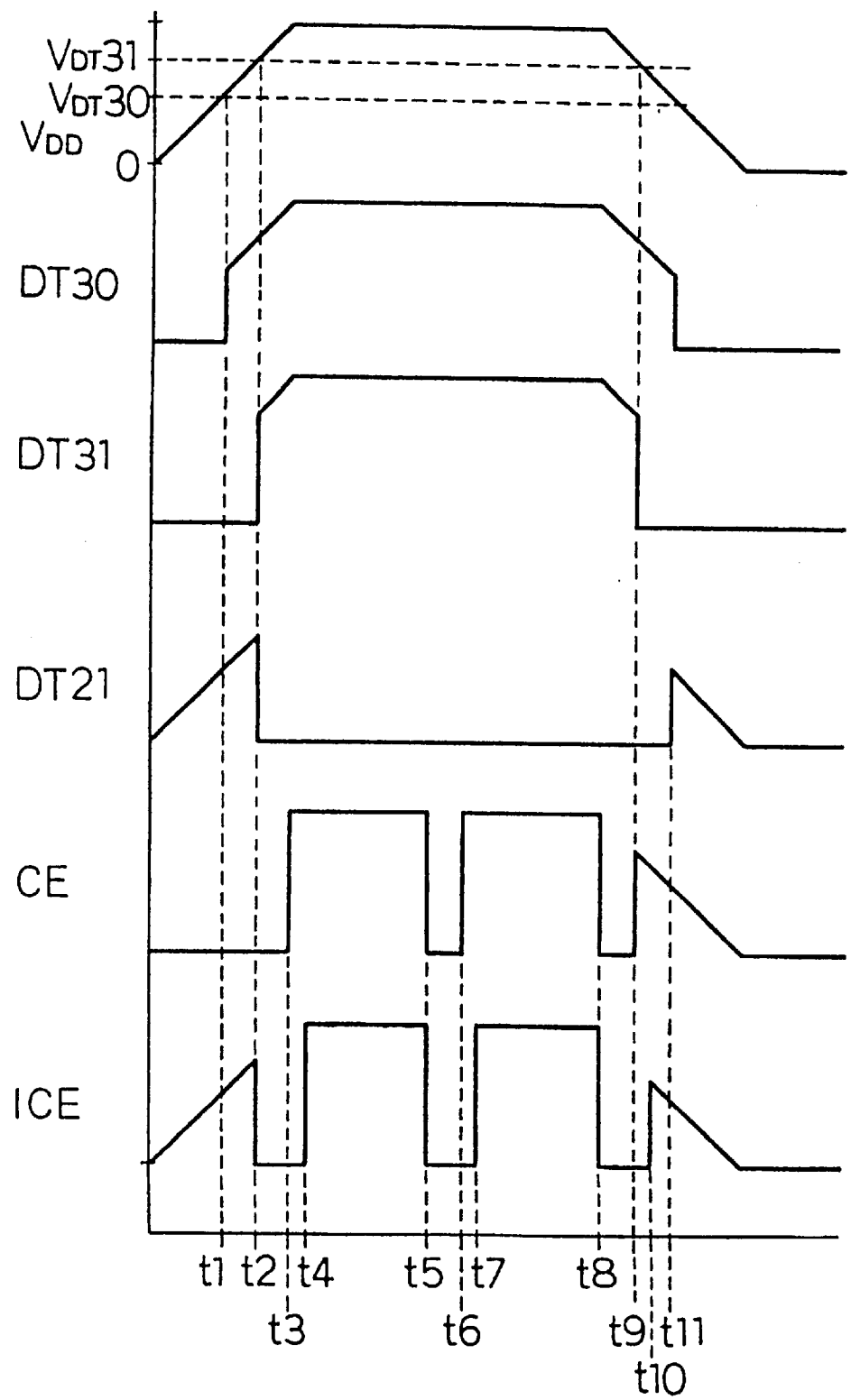
FIG. 18 show the operational timing chart of the power-on/off reset circuit of the eighth embodiment of the present invention.

In the eighth embodiment, the voltage detection signal VDT 21 of the fifth embodiment is provided with a voltage hysteresis. FIG. 17 shows the construction of the circuit of the eighth embodiment of the present invention (corresponding to claim 15) and FIG. 18 shows the operational timing chart of the power-on/off reset circuit. In these drawings, VDD, CE, and ICE represent a power-supply voltage, an external input control signal, and an internal control signal, respectively.

The present embodiment includes a voltage detection circuit which detects the detection voltages VDT 30 and VDT 31 and generates the voltage detection signal DT 21 which is detected by the voltage detection signals DT 30 and DT 31 and has a power-supply voltage hysteresis (the circuit 54 shown in FIG. 17). When the logical voltage of the voltage detection signal DT 21 is at "H", a new operational sequence is prevented.

The internal control signal ICE has a fixed time period which starts at the point where the logical voltage of the OR signal of the voltage detection signal DT 21 and the external input control signal CE goes to "L". In short, the internal control signal ICE keeps its logical voltage at "L" for a fixed time period even if the logical voltage of the external input control signal CE goes to "H".

In the power-on/off reset of this operation, an on-going sequence can be completed even if the power supply is decreased, and a new operational sequence can be prevented. Consequently, it is effectively used for a strong dielectric memory which is a non-volatile memory demanding re-writing of data. Furthermore, since the voltage detection signal DT 21 with a power-supply voltage hysteresis is outputted through the two voltage detection signals DT 30 and DT 31, the voltage detection signal to be outputted is stable against the fluctuation of the power-supply voltage. As a result, data in the non-volatile memory can be prevented from being destroyed at a low voltage.

Embodiment 9

Figure 19:
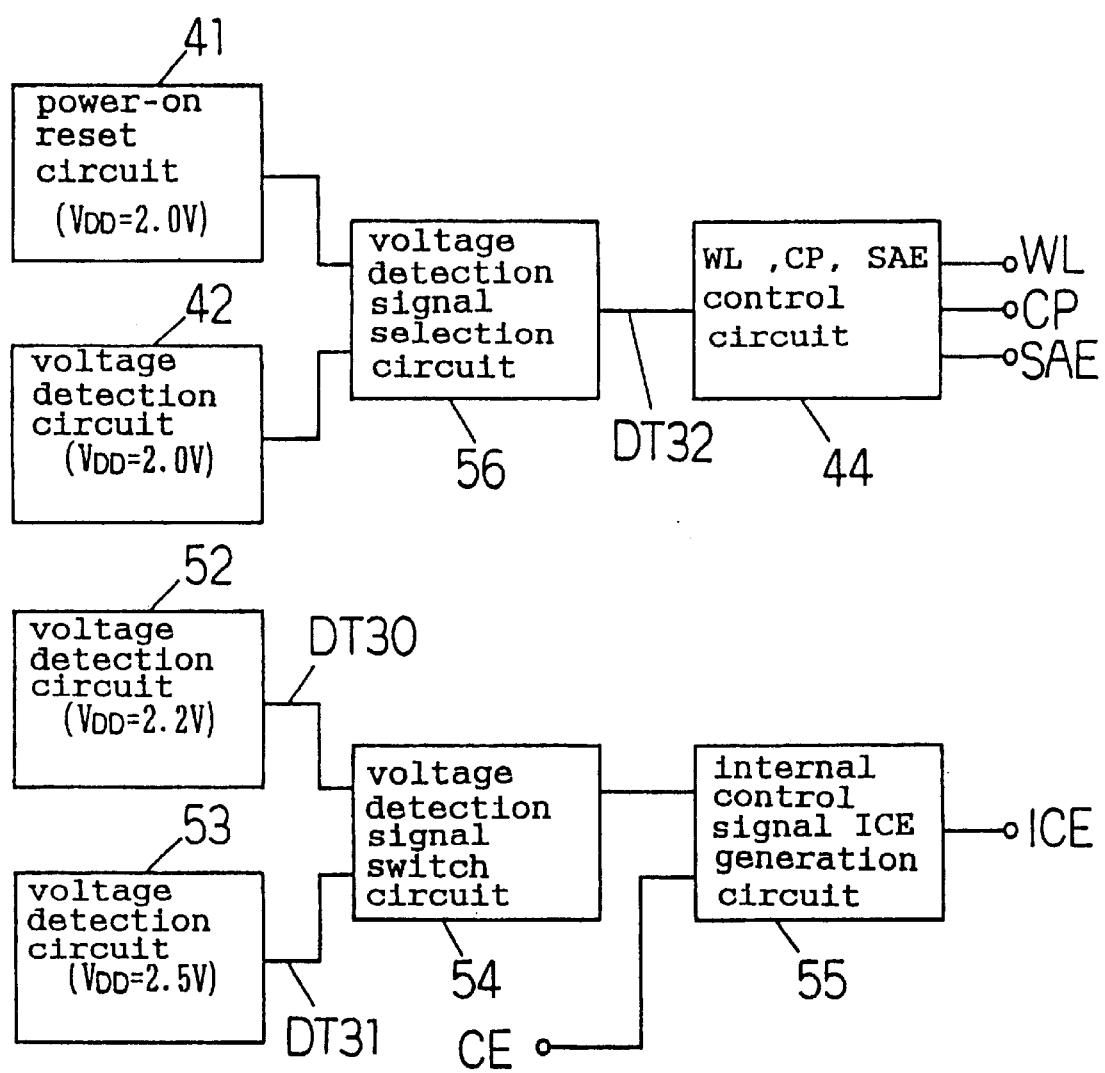
FIG. 19 show the operational timing chart of the power-on/off reset circuit of the ninth embodiment of the present invention.
Figure 20:
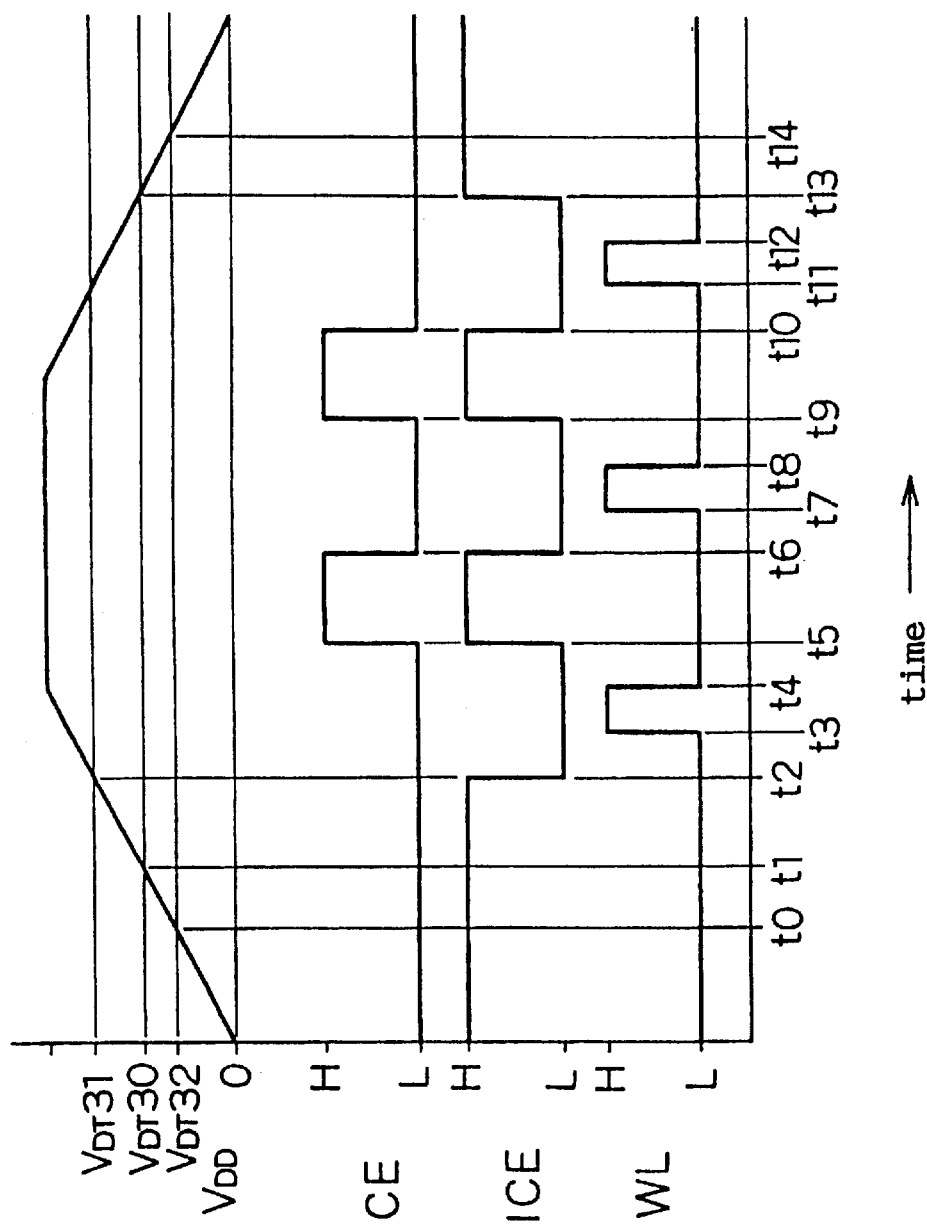
FIG. 20 show the operational timing chart of the power-on/off reset circuit of the ninth embodiment of the present invention.

FIG. 19 shows the construction of the power-on/off reset circuit of the ninth embodiment of the present invention (corresponding to claims 16 and 17), and FIG. 20 shows the timing chart of the operation. The present embodiment has a voltage detection signal DT 32 which detects a further lower power-supply voltage in addition to the voltage detection signals DT 30 and DT 31 of the sixth embodiment, and which controls the power-supply voltage hysteresis with the voltage detection signals DT 30 and DT 31. The voltage detection signal DT 32 is outputted from the voltage detection signal selection circuit 56 which generates the OR of the power-on reset circuit 41 and the voltage detection circuit 42, and controlled by both the wait reset signal of the power-on reset circuit 41 when the power supply is turned on and the detection signal of the voltage detection circuit 42 for low voltage.

The internal control signal ICE is controlled by the VDT 31 when the power-supply voltage increases, and controlled by the VDT 30 when the power-supply voltage decreases. These voltage detection signals VDT 30 and VDT 31 prevent a new operational sequence, and immediately suspend the operation when the voltage is equal to or lower than the voltage which is detected by the voltage detection signal VDT 32. Furthermore, a certain time period is secured for an on-going sequence to be completed before the power-supply voltage drops from the voltage detection signal VDT 30 to the voltage detection signal VDT 32. When the power-supply voltage is equal to or lower than the VDT 32, the word line signal WL immediately suspends the operation. Consequently, for example, when the power supply is turned on, the logical voltage of the word line signal WL is set at "L" without fail and the wrong operation of a memory cell in a strong dielectric memory can be prevented.

Embodiment 10

The tenth embodiment is an application of a strong dielectric memory unit in an RF-ID tag semiconductor device or the like which is provided with the voltage detection circuit, power-on/off reset circuit, and non-volatile strong dielectric memory of the above-explained embodiments.

Figure 21:
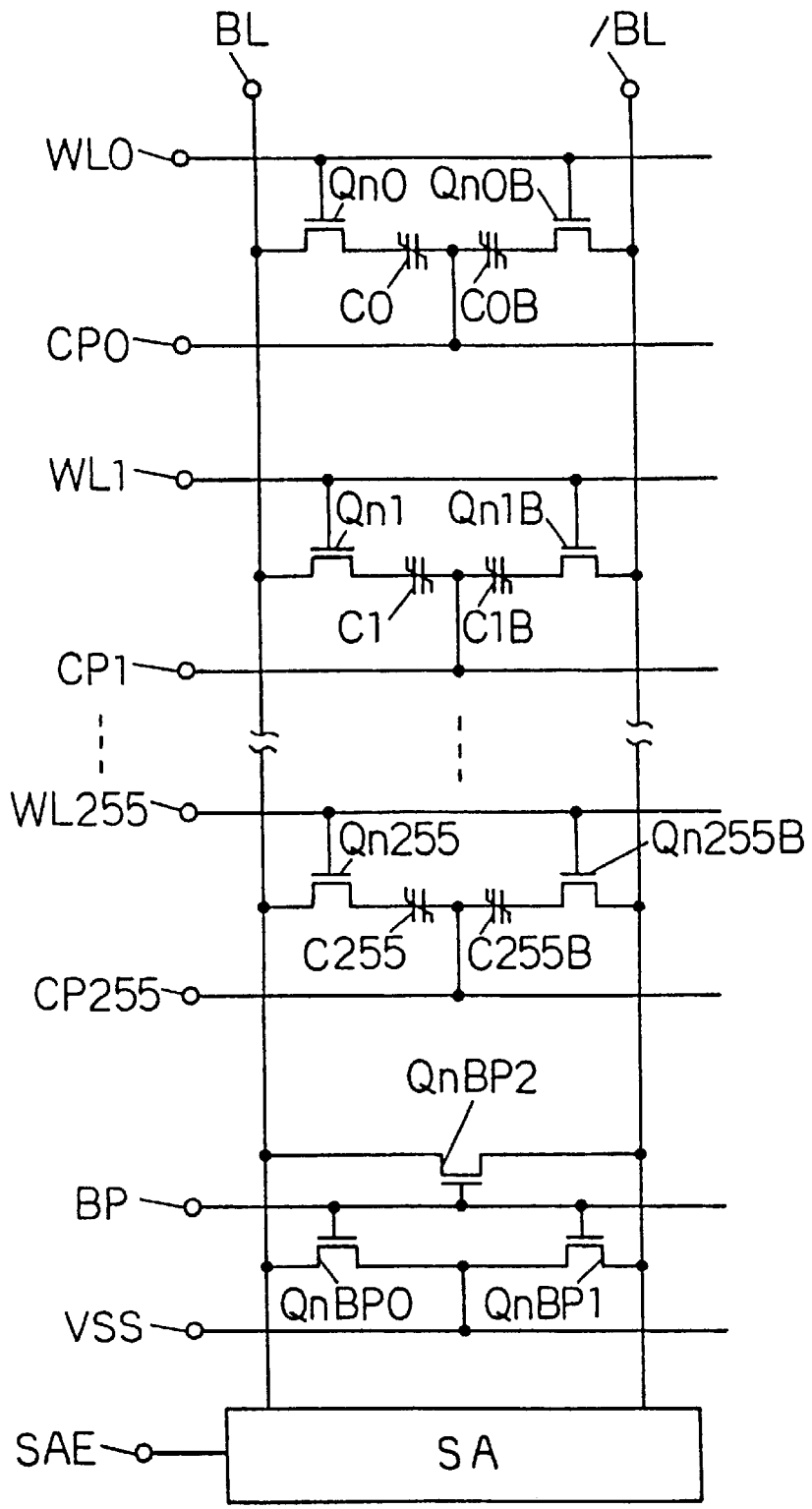
FIG. 21 shows the circuit construction of the strong dielectric memory unit of a semiconductor device provided with a non-volatile strong dielectric memory which is controlled by the power-on/off reset circuit of the tenth embodiment of the present invention.
Figure 22:
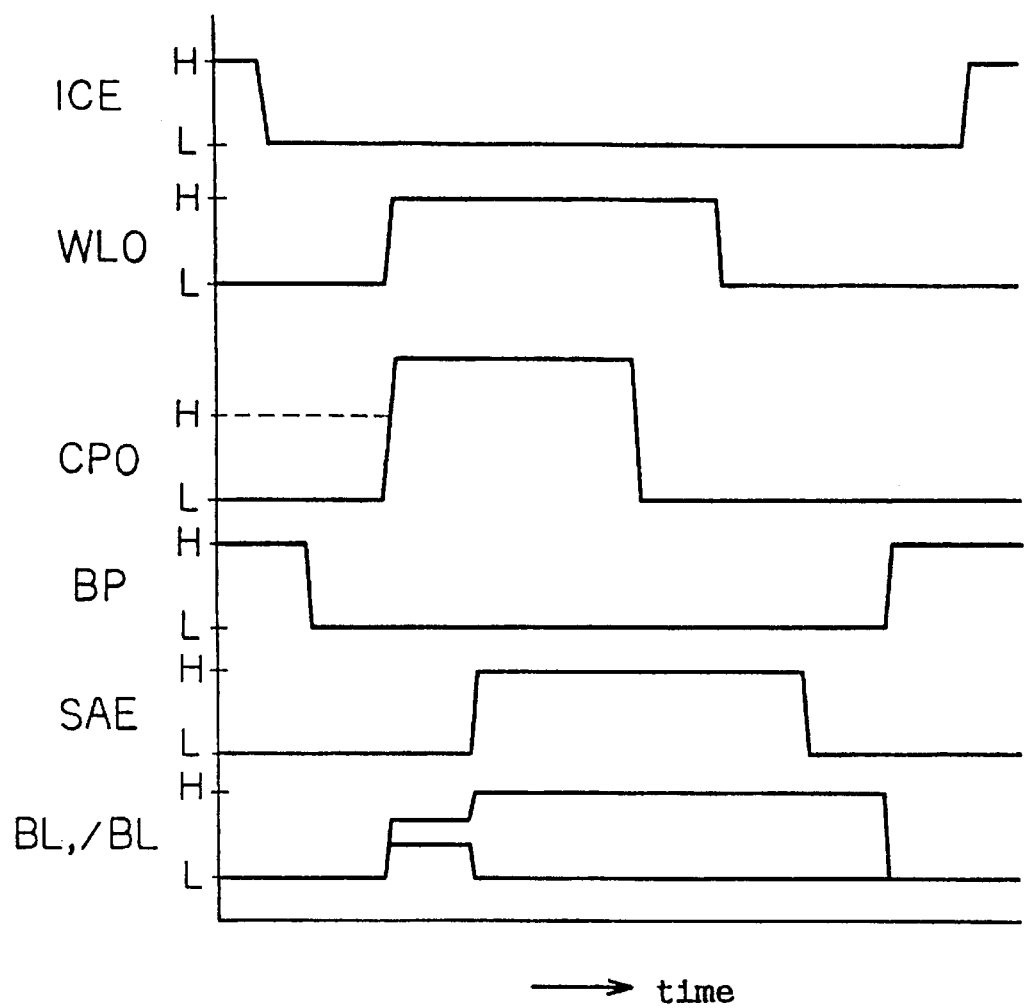
FIG. 22 shows the operational timing chart of the strong dielectric memory unit of the tenth embodiment of the present invention.
Figure 23:
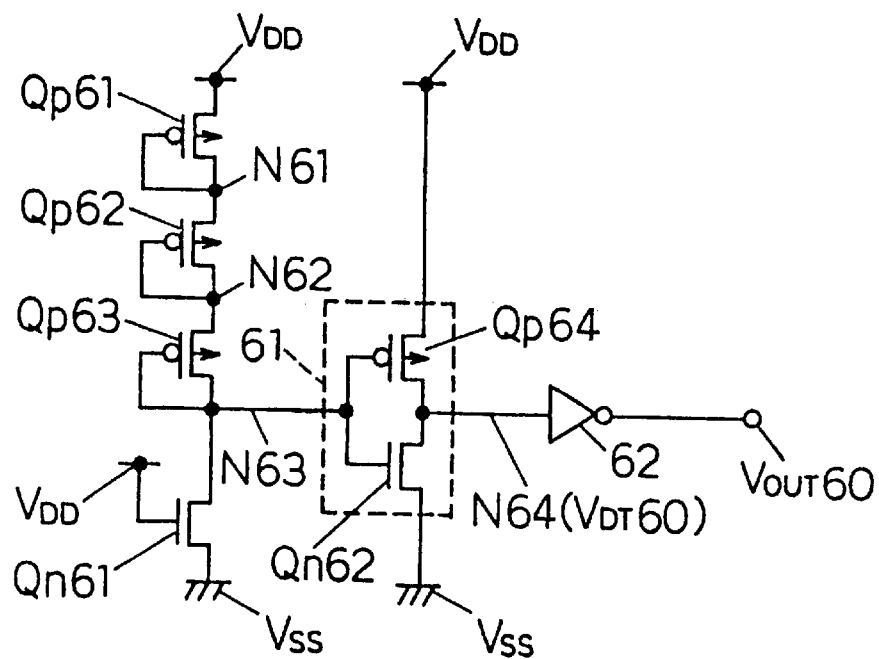
FIG. 23 shows the construction of a conventional voltage detection circuit.
Figure 24:
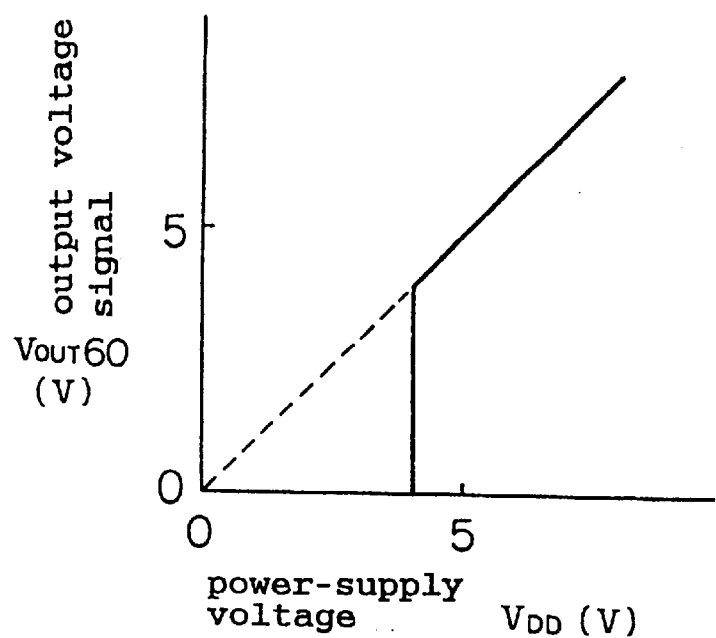
FIG. 24 shows the relationship between the power-supply voltage and the output voltage signal of the conventional voltage detection circuit.
Figure 25:
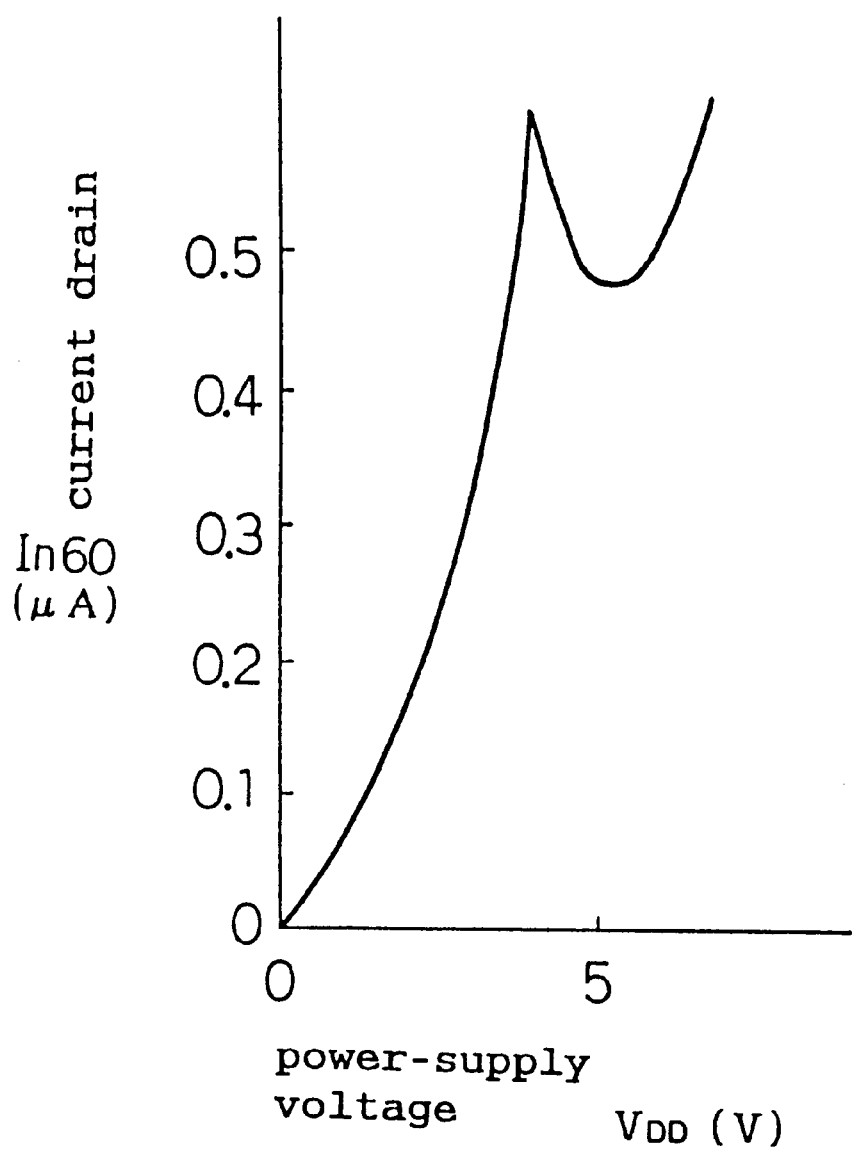
FIG. 25 shows the relationship between the power-supply voltage and the current drain of the conventional voltage detection circuit.

In the present embodiment, a one-bit memory cell is composed of two strong dielectric capacitors and two transistors, and these capacitors store complementary data. FIG. 21 shows the construction of the entire circuit, and FIG. 22 shows the timing chart of the operation. In these drawings, WL 0–WL 255 represent word lines, BL and /BL represent bit lines, CP 0–CP 255 represent cell plate electrodes, BP represents a bit line pre-charge control signal, SAE represents a sense amplifier control signal, VSS represents a ground voltage, SA represents a sense amplifier, C 0–C 255 and C 0B–C 255 B represent memory cell capacitors, and Qn 0–Qn 255, Qn 0B–Qn 255 B, and Qn BP0–Qn BP 2 represent N-channel type MOS transistors. The construction of the circuit shown in FIG. 21 will be explained briefly as follows. The sense amplifier SA is connected with the bit lines BL and /BL. The sense amplifier SA is controlled by the sense amplifier control signal SAE. The first electrode of the memory cell capacitor C 0 is connected with the bit line BL via the memory cell transistor Qn 0 whose gate electrode is connected with the word line WL 0, and the second electrode is connected with the cell plate electrode CP 0. The first electrode of the memory cell capacitor C 0B which is the pair to the memory cell capacitor C 0 is connected with the bit line /BL via the memory cell transistor Qn 0B whose gate electrode is connected with the word line WL 0, and the second electrode is connected with the cell plate electrode CP 0. The connections of the other memory cell capacitors C 1–C 255 and C 1B–C 255 B are the same as the memory cell capacitors C 0 and C 0B. Furthermore, the bit lines BL and /BL are connected with each other via the N-channel type MOS transistor Qn BP2. The bit line BL and the ground voltage VSS are connected with each other via the N-channel type MOS transistor Qn BP0, and the bit line /BL and the ground voltage VSS are connected with each other via the N-channel type MOS transistor Qn BP1. The gate electrodes of the N-channel type MOS transistors Qn BP0–Qn BP 2 are connected with the bit line pre-charge control signal BP. The operation of the strong dielectric memory device circuit will be explained as follows with reference to the operational timing chart shown in FIG. 22. Firstly, in order to read data from the memory cell, the logical voltage of the bit lines BL and /BL is set at "L" by setting the logical voltage of the bit line pre-charge control signal BP at "H". Furthermore, the word line WL 0–WL 255 and the cell plate electrode CP are made the ground voltage VSS whose logical voltage is "L". Next, the logical voltage of the bit line pre-charge control signal BP is set at "L", thereby putting the bit lines BL and /BL in the floating state. Then, the logical voltage of the word line WL 0 and the cell plate electrode CP is set at "H", thereby reading out data from the memory cell capacitors C 0 and C 0B to the bit lines BL and /BL. Then, the logical voltage of the cell plate electrode CP is set at "L", so that the data of the memory cell capacitors C 0 and C 0B are re-written. Then, the logical voltage of the word line WL 0 is set at "L" so that no voltage is applied on the memory cell capacitors C 0 and C0 B. Then, the logical voltage of the sense amplifier control signal SAE is set at "L", to suspend the operation of the sense amplifier SA. Then, the logical voltage of the bit line pre-charge control signal BP is set at "H", thereby returning the logical voltage of the bit lines BL and /BL to the initial state of "L".

Thus, if the voltage detection circuit and the power-on/off reset circuit of the present invention are used for the control of the strong dielectric memory, the destruction of data in the strong dielectric memory at a low voltage can be prevented, and as a result, a highly reliable device can be achieved.

Possibility of Industrial Use

The voltage detection circuit of the present invention can reduce the peak of the current drain and stabilize the voltage detection signal.

In addition, in the power-on/off reset of the present invention, no new operational sequence is mistakenly started when the power supply is turned on, and an on-going sequence can be properly terminated when the power supply is turned off.

Furthermore, the semiconductor of the present invention can prevent the wrong operation of a non-volatile memory.

What is claimed is:

1. A power-on/off reset circuit preventing a new operational sequence when a power-supply voltage is equal to or lower than a first voltage, and immediately suspending an operation when the power-supply voltage is equal to or lower than a second voltage, comprising
    a voltage detection circuit which detects a third voltage and outputs a signal, said signal being outputted only when the power supply is turned on, and said signal being outputted for a certain time period after the power supply is turned on,
    a first control circuit which, in response to the signal, immediately suspends operation when the power supply voltage is equal to or lower than the second voltage, and a second control circuit which, in response to the signal, completes an existing operational sequence and prevents a new operational sequence when the power supply voltage is equal to or lower than the first voltage.

2. A power-on/off reset circuit comprising a time for a power-supply voltage to drop from a first voltage to a second voltage, the time being longer than a predetermined operational sequence completion time,
- a voltage detection circuit which detects a third voltage and outputs a signal, said signal being outputted only when the power supply is turned on, and said signal being outputted for a certain time period after the power supply is turned on,
- a first control circuit which, in response to the signal, immediately suspends operation when the power supply voltage is equal to or lower than the second voltage, and
- a second control circuit which, in response to the signal, completes an existing operational sequence and prevents a new operational sequence when the power supply voltage is equal to or lower than the first voltage.

3. A power-on/off reset circuit comprising
- a first voltage detection circuit which detects a first voltage and outputs a first signal, and a second voltage detection circuit which detects a second voltage lower than the first voltage and outputs a second signal, preventing a new operational sequence when a power-supply voltage is equal to or lower than the first voltage, and immediately suspending an operation when the power-supply voltage is equal to or lower than the second voltage,
- a third voltage detection circuit which detects a third voltage and outputs a third signal, said third signal being outputted only when the power supply is turned on, and said third signal being outputted for a certain time period after the power supply is turned on, a fourth voltage detection circuit which detects a fourth voltage higher than the first voltage and outputs a fourth signal, a signal selection circuit which selects either the first signal or the fourth signal and outputs a fifth signal, a first control circuit which generates an OR output of the third signal and the second signal, and a second control circuit which generates an OR output of the third signal and the fifth signal.

4. A semiconductor device comprising a non-volatile memory and power-on/off reset circuit preventing a new operational sequence when a power-supply voltage is equal to or lower than a first voltage, and immediately suspending an operation when the power-supply voltage is equal to or lower than a second voltage, wherein
- the semiconductor device is characterized by not operating the non-volatile memory when the power-supply voltage is equal to or lower than the second voltage,
- a voltage detection circuit which detects a third voltage and outputs a signal, said signal being outputted only when the power supply is turned on, and said signal being outputted for a certain time period after the power supply is turned on,
- a first control circuit which, in response to the signal, immediately suspends operation when the power supply voltage is equal to or lower than the second voltage, and
- a second control circuit which, in response to the signal, completes an existing operational sequence and prevents a new operational sequence when the power supply voltage is equal to or lower than the first voltage.

5. A power-on/off reset circuit comprising:
- a first voltage detection circuit which detects a first voltage and outputs a first signal,
- a second voltage detection circuit which detects a second voltage lower than the first voltage and outputs a second signal,
- a third voltage detection circuit which detects a third voltage and outputs a third signal, said third signal being outputted only when the power supply is turned on, and said third signal being outputted for a certain time period after the power supply is turned on,
- a first control circuit which, in response to the third signal or the second signal, immediately suspends operation when the power supply voltage is equal to or lower than the second voltage, and
- a second control circuit which, in response to the third signal or the first signal, completes an existing operational sequence and prevents a new operational sequence when the power supply voltage is equal to or lower than the first voltage.

6. The power-on/off reset circuit of claim 5 including a fourth voltage detection circuit which detects a fourth voltage higher than the first voltage and outputs a fourth signal, which is ORed with the first signal to produce a fifth signal,
- wherein the second control circuit, in response to the third signal or the fifth signal, completes the existing operational sequence and prevents a new operational sequence.

7. The power-on/off reset circuit of claim 1 including
- a first voltage detection circuit which detects the first voltage and outputs a first signal,
- a second voltage detection circuit which detects the second voltage lower than the first voltage and outputs a second signal,
- wherein the voltage detection circuit which detects the third voltage and outputs the signal is a third voltage detection circuit outputting a third signal,
- said third signal being outputted only when the power supply is turned on, and said third signal being outputted for a certain time period after the power supply is turned on,
- the first control circuit which, in response to the third signal or the second signal, immediately suspends operation when the power supply voltage is equal to or lower than the second voltage, and
- the second control circuit which, in response to the third signal or the first signal, completes an existing operational sequence and prevents a new operational sequence when the power supply voltage is equal to or lower than the first voltage.

8. The power-on/off reset circuit of claim 7 including a a fourth voltage detection circuit which detects a fourth voltage higher than the first voltage and outputs a fourth signal, which is ORed with the first signal to produce a fifth signal,
- wherein the second control circuit, in response to the third signal or the fifth signal, completes the existing operational sequence and prevents a new operational sequence.

9. The power[]on/off reset circuit of claim 2 including
- a first voltage detection circuit which detects the first voltage and outputs a first signal,
- a second voltage detection circuit which detects the second voltage lower than the first voltage and outputs a second signal, wherein the voltage detection circuit which detects the third voltage and outputs the signal is a third voltage detection circuit outputting a third signal, said third signal being outputted only when the power supply is turned on, and said third signal being outputted for a certain time period after the power supply is turned on, the first control circuit which, in response to the third signal or the second signal, immediately suspends operation when the power supply voltage is equal to or lower than the second voltage, and the second control circuit which, in response to the third signal or the first signal, completes an existing operational sequence and prevents a new operational sequence when the power supply voltage is equal to or lower than the first voltage.

10. The power-on/off reset circuit of claim 9 including a fourth voltage detection circuit which detects a fourth voltage higher than the first voltage and outputs a fourth signal, which is ORed with the first signal to produce a fifth signal, wherein the second control circuit, in response to the third signal or the fifth signal, completes the existing operational sequence and prevents a new operational sequence.

11. The power-on/off reset circuit of claim 4 including a first voltage detection circuit which detects the first voltage and outputs a first signal, a second voltage detection circuit which detects the second voltage lower than the first voltage and outputs a second signal, wherein the voltage detection circuit which detects the third voltage and outputs the signal is a third voltage detection circuit outputting a third signal, said third signal being outputted only when the power supply is turned on, and said third signal being outputted for a certain time period after the power supply is turned on, the first control circuit which, in response to the third signal or the second signal, immediately suspends operation when the power supply voltage is equal to or lower than the second voltage, and the second control circuit which, in response to the third signal or the first signal, completes an existing operational sequence and prevents a new operational sequence when the power supply voltage is equal to or lower than the first voltage.

12. The power-on/off reset circuit of claim 11 including a fourth voltage detection circuit which detects a fourth voltage higher than the first voltage and outputs a fourth signal, which is ORed with the first signal to produce a fifth signal, wherein the second control circuit, in response to the third signal or the fifth signal, completes the existing operational sequence and prevents a new operational sequence.

* * * * *

UNITED STATES PATENT AND TRADEMARK OFFICE
CERTIFICATE OF CORRECTION

PATENT NO. : 6,538,482 B2
DATED : March 25, 2003
INVENTOR(S) : Hirano et al.

It is certified that error appears in the above-identified patent and that said Letters Patent is hereby corrected as shown below:

<u>Title page,</u>
Insert Items
-- [22] PCT Filed: August 14, 1996 --
-- [86] PCT No.: PCT/JP96/02295 --

Signed and Sealed this

Seventh Day of October, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,538,482 B2
DATED          : March 25, 2003
INVENTOR(S)    : Hirano et al.

It is certified that error appears in the above-identified patent and that said Letters Patent is hereby corrected as shown below:

<u>Title page,</u>
Item [62], Related U.S. Application Data, delete "Division of application No. 09/198,726, filed on Nov. 24, 1998, now Pat. No. 6,246,624, which is a division of application No. 08/817,746, filed on July 9, 1997, now Pat. No. 5,864,247" and insert -- Division of application No. 09/198,726, filed on Nov. 24, 1998, now Pat. No. 6,246,624, which is a division of application No. 08/817,746, filed on July 9, 1997, now Pat. No. 5,864,247, filed as application No. PCT/JP96/02295 on August 14, 1996. --

Signed and Sealed this

Twenty-seventh Day of January, 2004

JON W. DUDAS
*Acting Director of the United States Patent and Trademark Office*